(12) United States Patent
Kim et al.

(10) Patent No.: US 11,004,920 B2
(45) Date of Patent: May 11, 2021

(54) DISPLAY DEVICE AND METHOD OF MANUFACTURING THE SAME

(71) Applicant: SAMSUNG DISPLAY CO., LTD., Yongin-si (KR)

(72) Inventors: Yool Guk Kim, Hwaseong-si (KR); Jae Hoon Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/550,718

(22) Filed: Aug. 26, 2019

(65) Prior Publication Data
US 2020/0251541 A1 Aug. 6, 2020

(30) Foreign Application Priority Data
Feb. 1, 2019 (KR) ........................ 10-2019-0013976

(51) Int. Cl.
*H01L 27/32* (2006.01)
*H01L 51/56* (2006.01)

(52) U.S. Cl.
CPC ...... *H01L 27/3246* (2013.01); *H01L 27/3248* (2013.01); *H01L 51/56* (2013.01)

(58) Field of Classification Search
CPC .. H01L 27/3246; H01L 27/3248; H01L 51/56
See application file for complete search history.

(56) References Cited

U.S. PATENT DOCUMENTS

| 9,536,931 | B2 * | 1/2017 | Kim | H01L 27/3246 |
| 2005/0285509 | A1 * | 12/2005 | Funamoto | H01L 51/5275 313/504 |
| 2013/0105782 | A1 * | 5/2013 | Matsushima | H01L 51/0005 257/40 |
| 2013/0126839 | A1 * | 5/2013 | Matsushima | H01L 51/56 257/40 |
| 2014/0042402 | A1 * | 2/2014 | Prushinskiy | H01L 51/0013 257/40 |
| 2015/0060826 | A1 * | 3/2015 | Matsumoto | H01L 27/3246 257/40 |

(Continued)

FOREIGN PATENT DOCUMENTS

| KR | 10-0600527 | 7/2006 |
| KR | 10-2009-0035768 | 4/2009 |

(Continued)

*Primary Examiner* — Hoang-Quan Ho
(74) *Attorney, Agent, or Firm* — Lewis Roca Rothgerber Christie LLP

(57) ABSTRACT

A display device includes a substrate, a plurality of pixels on the substrate, a first electrode arranged for each pixel on the substrate, a pixel defining layer on the substrate along a boundary of each pixel and including an opening exposing the first electrode of the pixel, an organic layer on the first electrode in the opening of the pixel defining layer, and a second electrode on the organic layer, the pixel defining layer including a first pixel defining layer and a second pixel defining layer stacked on a surface of the first pixel defining layer, the surface of the first pixel defining layer including an upper surface and a side surface, and a surface roughness of the upper surface of the first pixel defining layer being greater than a surface roughness of the first electrode.

20 Claims, 23 Drawing Sheets

(56) References Cited

U.S. PATENT DOCUMENTS

| | | | |
|---|---|---|---|
| 2016/0155784 A1* | 6/2016 | Park | H01L 27/3246 |
| | | | 257/88 |
| 2017/0062540 A1* | 3/2017 | Kim | H01L 27/3246 |
| 2018/0006256 A1* | 1/2018 | Tojo | H01L 27/28 |
| 2020/0006458 A1* | 1/2020 | Lim | H01L 27/3246 |
| 2020/0075634 A1* | 3/2020 | Sim | H01L 27/3276 |
| 2020/0075699 A1* | 3/2020 | Kim | H01L 27/3246 |
| 2020/0220081 A1* | 7/2020 | Kishimoto | H01L 27/3246 |

FOREIGN PATENT DOCUMENTS

| | | | |
|---|---|---|---|
| KR | 20110085136 A * | 7/2011 | H01L 51/5203 |
| KR | 10-1452370 | 10/2014 | |
| KR | 10-2014-0139820 | 12/2014 | |
| KR | 10-2018-0078657 | 7/2018 | |

\* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2019-0013976, filed on Feb. 1, 2019 in the Korean Intellectual Property Office, the entire content of which is herein incorporated by reference.

BACKGROUND

1. Field

Aspects of embodiments of the present disclosure relate to a display device and a method of manufacturing the same.

2. Description of the Related Art

Display devices have become increasingly important with the development of multimedia. In response thereto, various display devices, such as a liquid crystal display device, an organic light emitting display device, and the like, have been developed.

For example, an organic light emitting display device includes two electrodes and an organic light emitting element including an organic light emitting layer interposed therebetween to emit light. Since the organic light emitting display device includes the organic light emitting element which is controlled for each pixel, it can be implemented as a thin and lightweight display device with low power consumption, and has characteristics such as wide viewing angle, high luminance and contrast, and fast response speed. Thus, it has been attracting attention as a next-generation display device.

The organic light emitting display device includes a plurality of pixels, and may further include a pixel defining layer for defining a boundary of each pixel. The pixel defining layer may be formed by laminating two or more different kinds of layers. If a bonding force between the different types of layers is weak, the layer may be peeled off during a process. The components of the peeled layer may adversely affect the formation of the organic layer, which may degrade the display quality and reliability of the entire display device.

SUMMARY

According to an aspect of embodiments of the present disclosure, a display device with improved adhesion between a first pixel defining layer and a second pixel defining layer is provided.

According to another aspect of embodiments of the present disclosure, a method of manufacturing a display device capable of improving adhesion between a first pixel defining layer and a second pixel defining layer is provided.

However, aspects of the present disclosure are not limited to those set forth herein. The above and other aspects of the present disclosure will become more apparent to one of ordinary skill in the art to which the present disclosure pertains by referencing the further detailed description of the present disclosure set forth below.

According to one or more embodiments of the present disclosure, a display device comprises a substrate, a plurality of pixels on the substrate, a first electrode arranged for each pixel on the substrate, a pixel defining layer on the substrate along a boundary of each pixel and including an opening exposing the first electrode of the pixel, an organic layer on the first electrode in the opening of the pixel defining layer, and a second electrode on the organic layer, wherein the pixel defining layer includes a first pixel defining layer and a second pixel defining layer stacked on a surface of the first pixel defining layer, wherein the surface of the first pixel defining layer includes an upper surface and a side surface, and wherein a surface roughness of the upper surface of the first pixel defining layer is greater than a surface roughness of the first electrode.

According to an aspect of embodiments of the present disclosure, the adhesive between the first pixel defining layer and the second pixel defining layer is improved, and the display quality and reliability of the display device is improved.

The aspects and effects of the present invention are not limited to the above-described aspects and effects, and other aspects and effects which are not described herein will become apparent to those skilled in the art from the following description.

BRIEF DESCRIPTION OF THE DRAWINGS

The above and other aspects and features of the present disclosure will become more apparent by describing in further detail some example embodiments thereof with reference to the attached drawings, in which.

DETAILED DESCRIPTION

Figure 1:
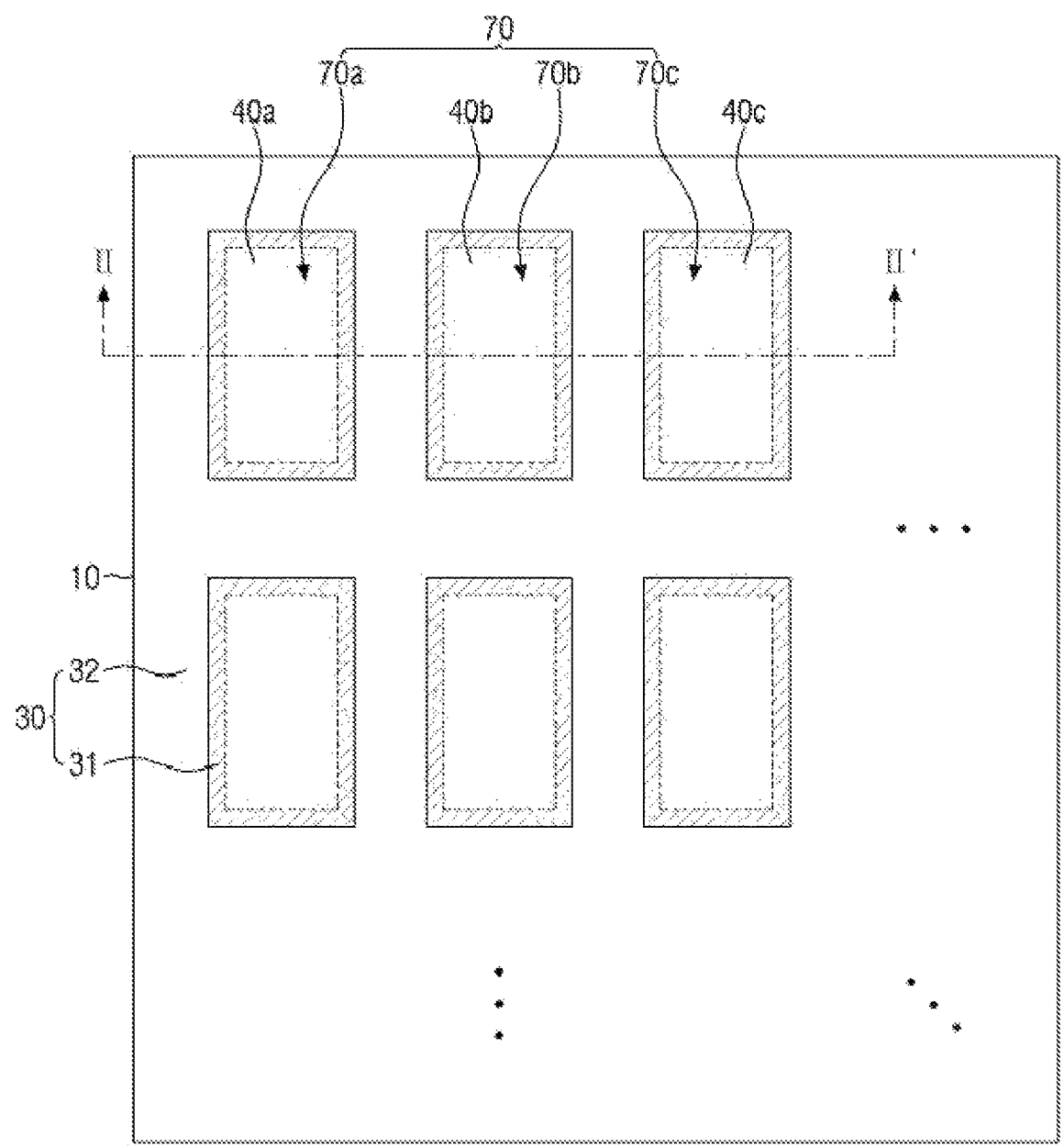
FIG. 1 is a plan view schematically showing a display device according to an embodiment.

Features of the inventive concept and methods of accomplishing the same may be understood more readily by reference to the following detailed description of some example embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will be defined by the appended claims. Like reference numerals refer to like elements throughout the specification.

It is to be understood that when an element or layer is referred to as being "on," "connected to," or "coupled to" another element or layer, it may be directly on, connected, or coupled to the other element, or one or more intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. For example, the device may be otherwise oriented (e.g., rotated 90 degrees or at other orientations) and the spatially relative descriptors used herein interpreted accordingly.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a "first" element, component, region, layer, or section discussed below could be termed a "second" element, component, region, layer, or section without departing from the teachings of the inventive concept.

The meaning of "include" or "comprise" may specify a property, a fixed number, a step, an operation, an element, a component, or a combination thereof, but does not exclude other properties, fixed numbers, steps, operations, elements, components, or combinations thereof.

Unless otherwise defined, all terms (including technical and scientific terms) used herein have the same meaning as commonly understood by one of ordinary skill in the art to which example embodiments of the inventive concepts belong. It is to be further understood that terms, such as those defined in commonly-used dictionaries, should be interpreted as having a meaning that is consistent with their meaning in the context of the relevant art and are not to be interpreted in an idealized or overly formal sense unless expressly so defined herein.

Herein, some example embodiments of the present disclosure will be described with reference to the drawings.

FIG. 1 is a plan view schematically showing a display device according to an embodiment. Referring to FIG. 1, a display device 1 according to an embodiment may include a plurality of pixels 70 disposed on a substrate 10 in a plan view.

Although FIG. 1 illustrates that each pixel 70 has a rectangular shape, the shape of the pixel 70 is not limited thereto, and may be a circular shape, an elliptical shape, or a polygonal shape.

In an embodiment, the pixels 70 may include a first pixel 70a, a second pixel 70b, and a third pixel 70c. In an embodiment, the first pixel 70a, the second pixel 70b, and the third pixel 70c may have the same shape, but the present disclosure is not limited thereto. For example, at least one of the first pixel 70a, the second pixel 70b, and the third pixel 70c may have a shape different from that of the remaining pixels, and the first pixel 70a, the second pixel 70b, and the third pixel 70c may have different shapes.

The first pixel 70a, the second pixel 70b, and the third pixel 70c may display different colors. For example, the first pixel 70a may be a red pixel for displaying red, the second pixel 70b may be a green pixel for displaying green, and the third pixel 70c may be a blue pixel for displaying blue.

The pixels 70 may be arranged in a matrix form. The plurality of pixels 70 may be arranged such that the display colors have a stripe pattern. For example, a plurality of first pixels 70a may be successively arranged in a first pixel column, a plurality of second pixels 70b may be successively arranged in a second pixel column, and a plurality of third pixels 70c may be successively arranged in a third pixel column.

This arrangement rule may be repeated along a row direction. However, the arrangement of the pixels 70 is not limited to that described above. For example, the pixels 70 having the same arrangement and displaying different colors along a column direction may be alternately arranged. As another example, the plurality of pixels 70 may be arranged in a pentile pattern.

A pixel defining layer 30 is disposed at the boundary of each pixel 70. The pixel defining layer 30 may be disposed along the column boundary and/or the row boundary of the pixels 70. The overall planar shape of the pixel defining layer 30 may be a lattice shape.

The pixel defining layer 30 includes an opening exposing a portion of each pixel 70. A light emission region may be disposed in the opening of the pixel defining layer 30. The light emission region, which is a region where light is emitted from an organic light emitting element, may overlap the opening of the pixel defining layer 30. The region where the pixel defining layer 30 is located may be a non-emission region where no light is emitted.

An organic layer 40 may be disposed in the opening of the pixel defining layer 30. An organic layer 40a of the first pixel 70a, an organic layer 40b of the second pixel 70b, and an organic layer 40c of the third pixel 70c may emit light in colors of the corresponding pixels. However, the present disclosure is not limited thereto, and, in an embodiment, all of the organic layers 40a, 40b, and 40c may emit light of the same color, and a wavelength conversion member or a color filter may be disposed on a light emission path to display a different color for each pixel 70.

The pixel defining layer 30 may include a first pixel defining layer 31 and a second pixel defining layer 32. The second pixel defining layer 32 is disposed on the first pixel defining layer 31. The width of the second pixel defining layer 32 may be smaller than the width of the first pixel defining layer 31. In an embodiment, the second pixel defining layer 32 may completely overlap an inner portion of the first pixel defining layer 31 in a plan view. The second pixel defining layer 32 may expose a portion of the first pixel defining layer 31.

Although it is illustrated in the drawing that both the first pixel defining layer 31 and the second pixel defining layer 32 are arranged along the pixel row boundary and the pixel column boundary, various other modifications are possible.

In an embodiment, the second pixel defining layer 32 may be used to distinguish the arrangement of the organic layers for the respective pixels 70. For example, when the arrangement of the pixels 70 employs a stripe type method in which the pixels of the same color are arranged along the column direction, since different organic layers are arranged for the respective pixel columns, the second pixel defining layer 32 is arranged at the pixel column boundary to distinguish them. In an embodiment, in the case of the pixel row boundary, since the adjacent pixels 70 display the same color, the same material is applied to organic layers, and it is unnecessary to distinguish the organic layers for the respective rows of the pixels 70. Thus, the arrangement of the second pixel defining layer 32 may be omitted at the pixel row boundary. That is, the second pixel defining layer 32 may have a shape of a plurality of stripes rather than a lattice shape as a whole. In an embodiment, even when the second pixel defining layer 32 is arranged in a stripe pattern, the first pixel defining layer 31 may still be arranged in a lattice shape. In this case, an organic layer or a second electrode may be directly disposed on the first pixel defining layer 31 on the pixel row boundary without the second pixel defining layer 32. In another embodiment, the first pixel defining layer 31 may also be disposed in a stripe pattern by being omitted at the pixel row boundary, in the same manner as the second pixel defining layer 32.

Herein, a cross-sectional structure of the above-described display device 1 will be described in further detail.

Figure 2:
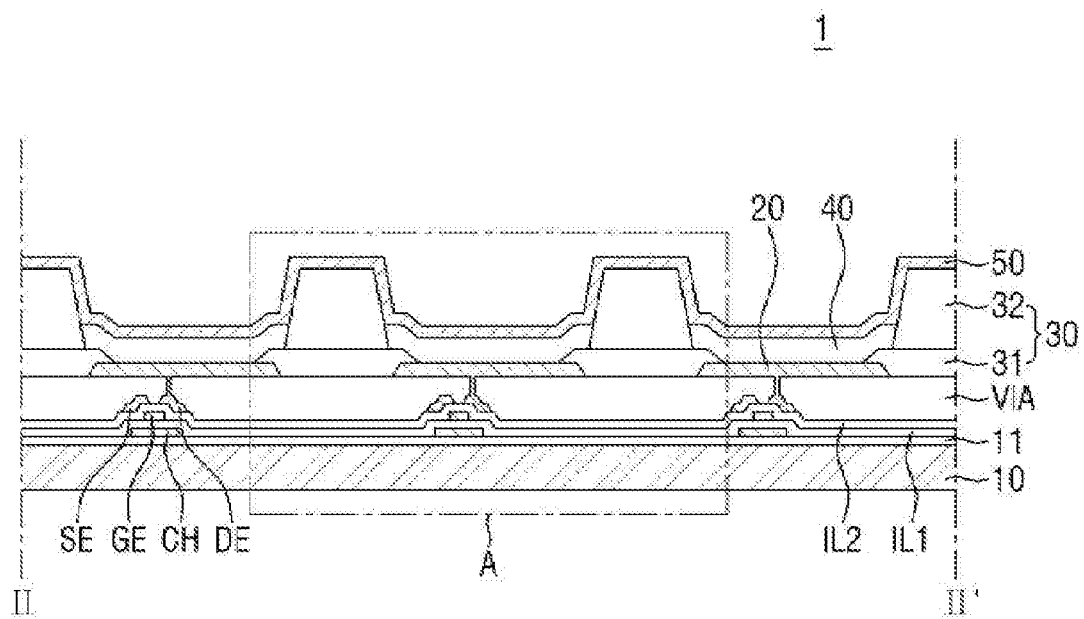
FIG. 2 is a cross-sectional view taken along the line II-II' of FIG. 1.
Figure 3:
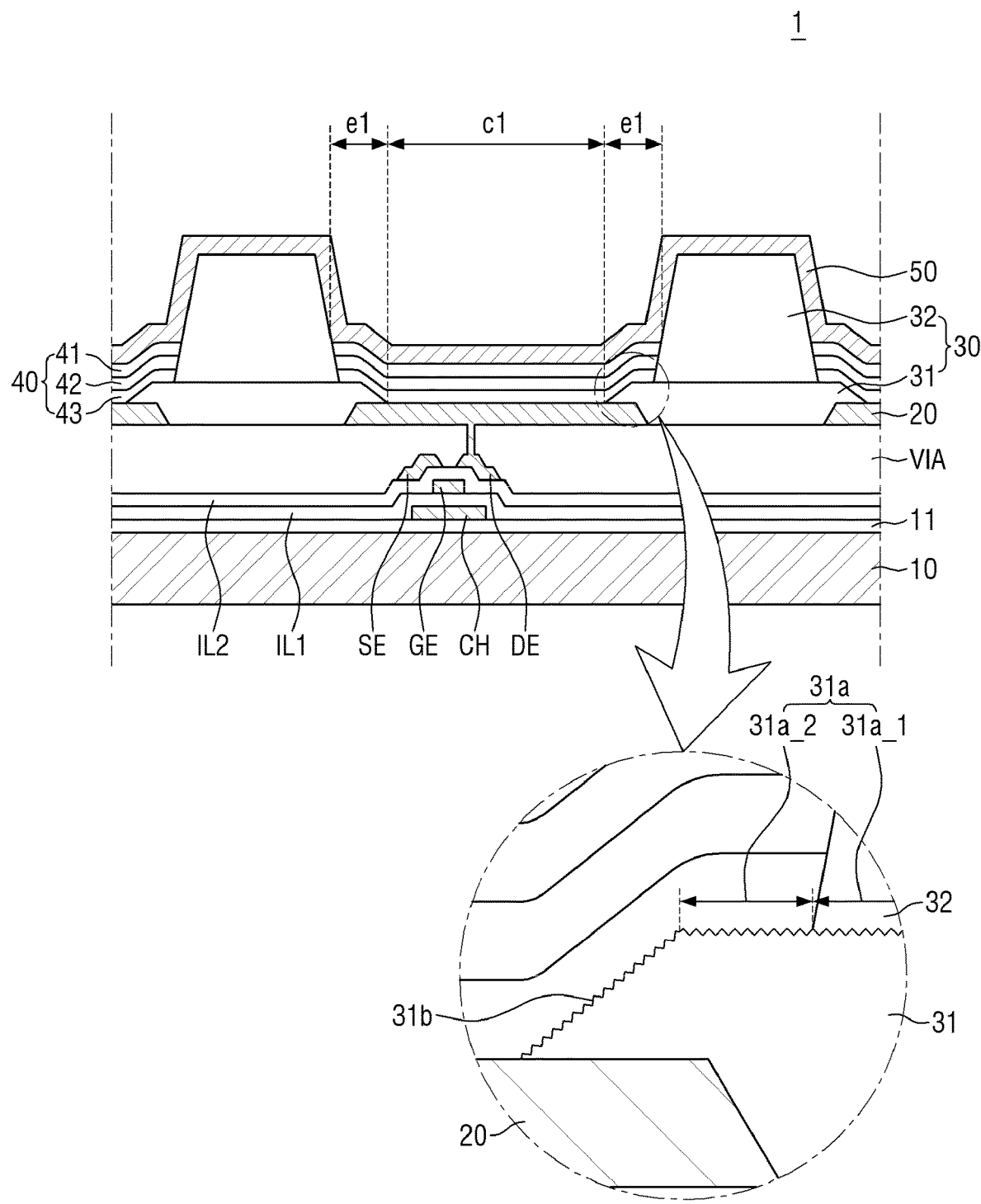
FIG. 3 is an enlarged cross-sectional view of a region "A" of FIG. 2.

FIG. 2 is a cross-sectional view taken along the line II-II' of FIG. 1. FIG. 3 is an enlarged cross-sectional view of a region "A" of FIG. 2.

Referring to FIGS. 1 to 3, a display device 1 according to an embodiment may include a substrate 10, a buffer layer 11 disposed on the substrate 10, a plurality of thin film transistors located on the buffer layer 11, a via layer VIA located on the thin film transistor, a first electrode 20 located on the via layer VIA, a pixel defining layer 30 located on the via layer VIA to expose at least a portion of the first electrode 20, an organic layer 40 located on the first electrode 20, and a second electrode 50 located on the organic layer 40.

The substrate 10 may include an insulating substrate. The substrate 10 may include any of glass, quartz, plastic, metal foil, and the like. The substrate 10 may be a rigid substrate or a flexible substrate which can be bent, folded, or rolled.

The buffer layer 11 may be disposed on the substrate 10. The buffer layer 11 functions to smooth the surface of the substrate 10 and to prevent or substantially prevent infiltration of moisture or external air.

On the buffer layer 11, a plurality of thin film transistors may be arranged for the respective pixels. The thin film transistor may include a semiconductor layer CH, a gate electrode GE, a source electrode SE, and a drain electrode DE.

The semiconductor layer CH may be disposed on the buffer layer 11, and a gate insulating film IL1 may be disposed on the semiconductor layer CH.

The gate electrode GE may be disposed on the gate insulating film IL1. The gate electrode GE may be formed of a conductive metal material. For example, the gate electrode GE may include any of molybdenum (Mo), aluminum (Al), copper (Cu), and titanium (Ti). The gate electrode GE may be a single film or a multilayer film.

An interlayer insulating film IL2 is disposed on the gate electrode GE. The interlayer insulating film IL2 may be an inorganic film.

The source electrode SE and the drain electrode DE are disposed on the interlayer insulating film IL2. The source electrode SE and the drain electrode DE are formed of a conductive metal material.

The via layer VIA is disposed on the source electrode SE, the drain electrode DE, and the interlayer insulating film IL2. Here, the via layer VIA is disposed to cover the thin film transistor. The via layer VIA may be a planarizing film. The via layer VIA may include an organic material, such as acryl or polyimide. In some embodiments, a passivation film (not shown) made of SiOx, SiNx, or the like may be further disposed between the via layer VIA and the thin film transistor.

A plurality of first electrodes 20 are disposed on the via layer VIA. The first electrode 20 may be electrically connected to the drain electrode DE (or the source electrode SE) of the thin film transistor through a via hole passing through the via layer VIA.

The first electrode 20 may be a pixel electrode disposed for each pixel 70. The first electrode 20 may be an anode electrode or a cathode electrode. When the first electrode 20 is an anode electrode, the second electrode 50 becomes a cathode electrode, and such embodiments will be described herein. However, in other embodiments, the first electrode 20 may be a cathode electrode and the second electrode 50 may be an anode electrode.

The first electrode 20 may include a conductive material having a high work function. The first electrode 20 may be formed of a material such as ITO, IZO, ZnO, or $In_2O_3$, or a laminated film thereof. When the display device 1 is a front emission type organic light emitting display device, the first electrode 20 may further include a reflective film formed of Ag, Mg, Al, Pt, Pd, Au, Ni, Nd, Ir, Cr, Li, Ca, or the like below the conductive film having a high work function.

The pixel defining layer 30 is disposed on the via layer VIA and the first electrode 20. The opening of the pixel defining layer 30 exposes at least a portion of the first electrode 20.

As described above, the pixel defining layer 30 includes the first pixel defining layer 31 and the second pixel defining layer 32, and the second pixel defining layer 32 is stacked on the first pixel defining layer 31.

In an embodiment, the first pixel defining layer 31 and the second pixel defining layer 32 may be formed of different materials. For example, the first pixel defining layer 31 may be an inorganic layer containing an inorganic material, and the second pixel defining layer 32 may be an organic layer containing an organic material. In some embodiments, the first pixel defining layer 31 may include at least one inorganic material selected from the group consisting of silicon oxide (SiOx), silicon nitride (SiNx), and silicon nitride oxide (SiON). In some embodiments, the second pixel defining layer 32 may include at least one organic material selected from the group consisting of polyimide resin, epoxy resin, acrylic resin, and the like.

The first pixel defining layer 31 may be formed to cover the edge of the first electrode 20 and form an opening partially exposing the first electrode 20. When the width of the first pixel defining layer 31 is larger than that of the second pixel defining layer 32 and the first pixel defining layer 31 protrudes outward beyond the second pixel defining layer 32, the opening of the pixel defining layer 30 may be defined substantially by the first pixel defining layer 31. The first electrode 20 may be in contact with the organic layer 40 disposed on the first electrode 20 through the opening of the first pixel defining layer 31.

The first pixel defining layer 31 has an upper surface 31a and a side surface 31b. The side surface 31b of the first pixel defining layer 31 has an inclination angle (e.g., a predetermined inclination angle) and may be formed between the upper surface of the first electrode 20 and the upper surface 31a of the first pixel defining layer 31. Further, the upper surface 31a of the first pixel defining layer 31 may have an overlap portion 31a_1 overlapping the second pixel defining layer 32 and an edge portion 31a_2 exposed by the second pixel defining layer 32.

The first pixel defining layer 31 and the second pixel defining layer 32 may be in direct contact with each other, and a surface of the first pixel defining layer 31 in contact with the second pixel defining layer 32 may have a surface roughness (e.g., a predetermined surface roughness). The surface roughness of a surface of the first pixel defining layer 31 may be larger than a surface roughness of the upper surface of the first electrode 20. In an embodiment, the surface roughness of a surface of the first pixel defining layer 31 may be formed by plasma treatment. A further detailed description thereof will be given later.

When a surface of the first pixel defining layer 31 has a surface roughness (e.g., a predetermined surface roughness), the contact area between the first pixel defining layer 31 and the second pixel defining layer 32 can be increased. Accordingly, the adhesion between the first pixel defining layer 31 and the second pixel defining layer 32 can be improved.

In an embodiment, the surface roughness formed on the first pixel defining layer 31 may be non-uniform over a surface of the first pixel defining layer 31. In an embodiment, for example, both the upper surface 31a and the side surface 31b of the first pixel defining layer 31 have a surface roughness larger than that of the upper surface of the first electrode 20, and the surface roughness of the upper surface 31a of the first pixel defining layer 31 may be larger than the surface roughness of the side surface 31b of the first pixel defining layer 31.

In an embodiment, the surface roughness of the upper surface 31a of the first pixel defining layer 31 may also be different in each region. For example, the surface roughness of the overlap portion 31a_1 of the upper surface 31a of the first pixel defining layer 31 overlapping the second pixel defining layer 32 may be different from the surface roughness of the edge portion 31a_2 of the upper surface 31a of the first pixel defining layer 31 which does not overlap the second pixel defining layer 32 and is exposed therefrom. In an embodiment, the surface roughness of the overlap portion 31a_1 of the upper surface 31a of the first pixel defining layer 31 may be smaller than the surface roughness of the edge portion 31a_2 of the upper surface 31a of the first pixel defining layer 31.

The above-described surface roughness can be expressed by a contact angle with water. In an embodiment, the water contact angle due to the surface roughness of a surface of the first pixel defining layer 31 may be in a range from 20° to 55° and, in an embodiment, from 40° to 50°.

As described above, when a surface of the first pixel defining layer 31 has a surface roughness (e.g., a predetermined surface roughness), the contact area between the first pixel defining layer 31 and the second pixel defining layer 32 increases, and the adhesion between the pixel defining layers 30 can be improved. Thus, it is possible to prevent or substantially prevent the second pixel defining layer 32 from being peeled off from the first pixel defining layer 31, and the organic layer 40 may be formed stably in a subsequent process, thereby ensuring processability and improving the display quality of the display device.

Further, as described later herein, the organic layer 40 may be formed to cover at least a portion of the first electrode 20 and the pixel defining layer 30, and the organic layer 40 may overlap the first electrode 20 and the first pixel defining layer 31 having a surface roughness (e.g., a predetermined surface roughness). In this case, the contact area between the organic layer 40 and the first pixel defining layer 31 is increased, and adhesion between the organic layer 40 and the first pixel defining layer 31 can be further improved.

The second pixel defining layer 32 may be stacked on a surface of the first pixel defining layer 31 to cover at least a portion of the first pixel defining layer 31. That is, the second pixel defining layer 32 overlaps the first pixel defining layer 31 and may expose at least a portion of the first pixel defining layer 31. The second pixel defining layer 32 may expose the side surface 31b of the first pixel defining layer 31 or expose both the side surface 31b and the edge portion 31a_2 of the upper surface 31a.

In an embodiment, a thickness of the second pixel defining layer 32 may be larger than a thickness of the first pixel defining layer 31. As the thickness of the second pixel defining layer 32 is relatively large, it is possible to prevent or substantially prevent an organic layer forming material from overflowing into adjacent pixels when forming the organic layer 40 corresponding to each pixel 70.

The organic layer 40 may be disposed on the first electrode 20. In an embodiment, the organic layer 40 may include an electron mediating layer 41, an organic light emitting layer 42, and a hole mediating layer 43, which are organic material layers included in the display device 1. Embodiments will be described by way of such an example herein.

The electron mediating layer 41, the organic light emitting layer 42, and the hole mediating layer 43 may be arranged in a structure in which three layers are stacked. The hole mediating layer 43 may be disposed on the first electrode 20, the organic light emitting layer 42 may be disposed on the hole mediating layer 43, and the electron mediating layer 41 may be disposed on the organic light emitting layer 42. The electron mediating layer 41, the organic light emitting layer 42, and the hole mediating layer 43 may be disposed separately for each pixel, but the present disclosure is not limited thereto.

The electron mediating layer 41 may include an electron injection layer EIL and/or an electron transport layer ETL.

The hole mediating layer 43 may include a hole injection layer HIL and/or a hole transport layer HTL.

The hole mediating layer 43 of the organic layer 40 may be in contact with the first electrode 20 and the side surface 31b of the first pixel defining layer 31 having a surface roughness (e.g., a predetermined surface roughness). Further, the edge of the hole mediating layer 43 may be formed to cover the upper surface 31a of the first pixel defining layer 31, and the hole mediating layer 43 may also be in contact with the edge portion 31a_2 of the upper surface 31a of the first pixel defining layer 31.

As the hole mediating layer 43 is in contact with the first pixel defining layer 31 having a surface roughness (e.g., a predetermined surface roughness), the contact area between the first pixel defining layer 31 and the hole mediating layer 43 can be further increased. Accordingly, the adhesion between the hole mediating layer 43 and the first pixel defining layer 31 can be further improved.

Light emission may be performed in the organic light emitting layer 42. When the holes and electrons generated by the first electrode 20 and the second electrode 50 are combined in the organic light emitting layer 42 and excitons formed at this time change their energy level from an excited state to a ground state, light having a color corresponding to the changed energy level may be emitted.

The light emission region, which is a region where light is emitted, may be substantially equal to or smaller than a region where the first electrode 20 and the organic layer 40 overlap each other. That is, a width of the light emission region may be equal to or smaller than a width of the region where the first electrode 20 and the organic layer 40 overlap each other.

The organic layer 40 may have a central portion and an edge portion. Referring to FIG. 3, a central portion c1 is a region where the organic layer 40 is in direct contact with the first electrode 20, and an edge portion e1 may be defined as a region where the organic layer 40 overlaps the adjacent pixel defining layer 30.

A thickness of the edge portion e1 and a thickness of the central portion c1 of the organic layer 40 may be different from each other. The thickness of the edge portion e1 of the organic layer 40 may be partially greater than the thickness of the central portion c1.

The edge portion e1 of the organic layer 40 may be formed so as to cover at least a portion of the surface of the first pixel defining layer 31 and/or the second pixel defining layer 32. For example, the edge portion e1 of the organic layer 40 may be formed to cover the side surface 31b of the first pixel defining layer 31 and/or the edge portion 31a_2 of the upper surface 31a of the first pixel defining layer 31. Further, the edge portion e1 of the organic layer 40 may be in contact with the side surface of the second pixel defining layer 32. Although FIG. 3 illustrates a case in which the organic layer 40 is formed to partially cover the surfaces of the first pixel defining layer 31 and the second pixel defining layer 32, the shape of the organic layer 40 is not limited thereto.

The central portion c1 of the organic layer 40 may be in contact with the first electrode 20 through the opening defined by the first pixel defining layer 31, and the edge portion e1 of the organic layer 40 may not be in contact with the first electrode 20. In other words, the first pixel defining layer 31 may separate and/or electrically isolate the edge portion e1 of the organic layer 40 from the first electrode 20. If the edge portion e1 of the organic layer 40 is separated from the first electrode 20 by the first pixel defining layer 31, holes may not be injected from the first electrode 20 to the edge portion e1 of the organic layer 40. Accordingly, a current from the first electrode 20 may flow only into the central portion c1 and the holes can be uniformly transported such that only the central portion c1 of the organic layer 40 may emit light and the light emission amount of the organic layer 40 may be constant, which in turn improves the display quality of the entire display device.

Figure 4A:
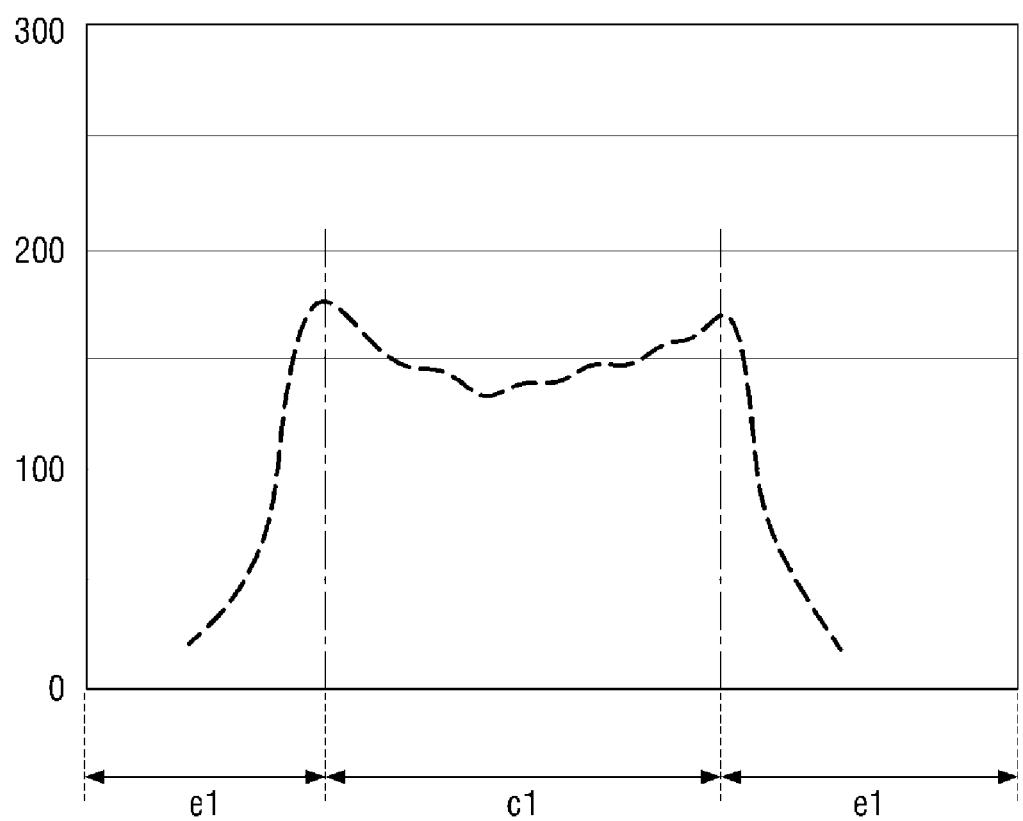
FIG. 4A is a diagram showing luminance of a display device according to a comparative example.
Figure 4B:
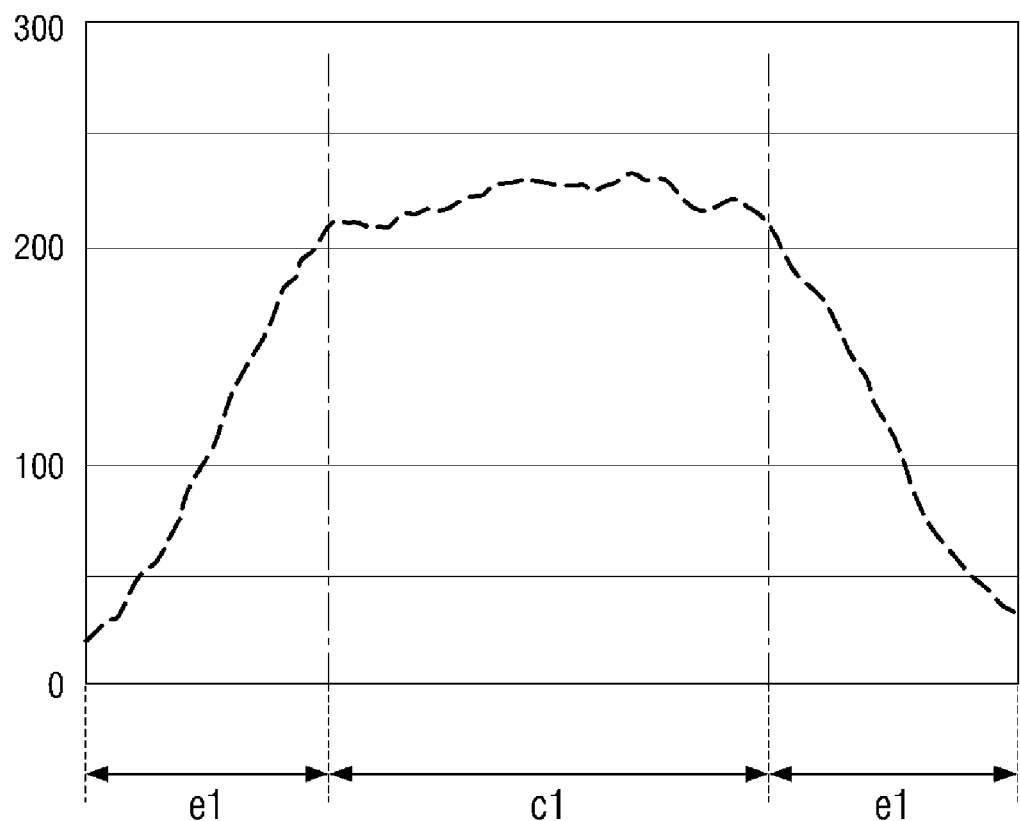
FIG. 4B is a diagram showing luminance of a display device according to an embodiment.

FIG. 4A is a diagram showing luminance of a display device according to a comparative example; and FIG. 4B is a diagram showing luminance of a display device according to an embodiment.

In FIGS. 4A and 4B, the X-axis represents positions corresponding to the central portion c1 and the edge portion e1 of the organic layer 40 shown in FIG. 3, and the Y-axis represents luminance (nit) measured according to the position of the organic layer 40. FIG. 4A shows a case in which the pixel defining layer has a single layer structure and at least a portion of the edge portion of the organic layer overlaps the first electrode.

Referring to FIG. 4A, in the display device according to the comparative example, the luminance is concentrated at the boundary between the central portion c1 and the edge portion e1, and, thus, the luminance in the central portion c1 appears non-uniform. The current is concentrated and the luminance is highest at the boundary between the central portion c1 and the edge portion e1, and the luminance decreases toward the center. Accordingly, the uniformity of light emission is reduced, and the current is concentrated at the boundary between the central portion c1 and the edge portion e1. As a result, the lifetime of the device may be shortened due to deterioration of the device.

On the other hand, in the display device 1 according to an embodiment of the present disclosure, since the first pixel defining layer 31 is formed on the edge portion e1 where the current is concentrated, the light emission amount can be maintained constant over the central portion c1 which is the light emission region. Thus, the luminance in the central portion c1 appears uniform and the luminance in the central portion c1 may be much higher than that of the comparative example. Further, it is possible to prevent or substantially prevent the current from being concentrated at the boundary between the central portion c1 and the edge portion e1, thereby preventing or substantially preventing deterioration of the device and improving the display quality of the entire display device.

Referring again to FIGS. 1 to 3, the second electrode 50 is disposed on the organic layer 40. When the second electrode 50 is used as a cathode electrode, the second electrode 50 may include a conductive material having a low work function. For example, the second electrode 50 may include Ag, Mg, Al, Pt, Pd, Au, Ni, Nd, Ir, Cr, Li, Ca, or the like. When the display device 1 is a front emission type organic light emitting display device, the second electrode 50 can secure transparency by forming the conductive film having a low work function as a thin film. In this case, the second electrode 50 may further include an auxiliary electrode, or may further include a transparent conductive film made of ITO, IZO, ZnO, or $In_2O_3$ on the conductive film having a low work function.

In an embodiment, the second electrode 50 may be a common electrode formed integrally without distinction of pixels. In an embodiment, the second electrode 50 may completely cover the structures, such as the organic layer 40, the first pixel defining layer 31, and the second pixel defining layer 32, located under the second electrode 50. For example, the second electrode 50 located on the organic layer 40 and the second electrode 50 located on the first pixel defining layer 31 and the second pixel defining layer 32 may be connected to each other.

Herein, some other embodiments of the present disclosure will be described. In the following embodiments, the same components as those of the above-described embodiment are denoted by the same reference numerals, and further description thereof will be omitted or simplified.

Figure 5:
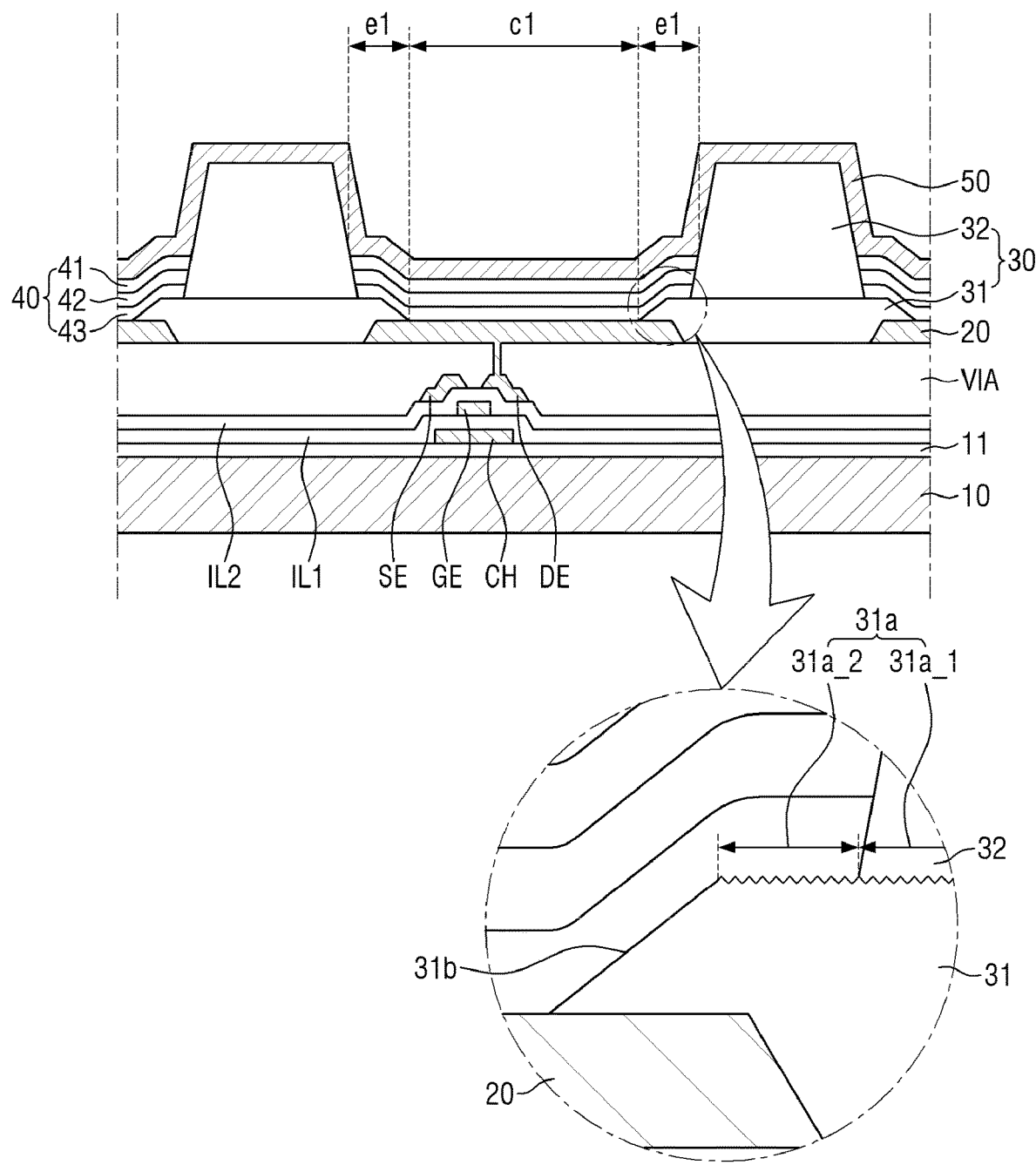
FIG. 5 is a cross-sectional view of a display device according to another embodiment.

FIG. 5 is a cross-sectional view of a display device according to another embodiment.

Referring to FIG. 5, a display device 2 according to an embodiment is the same as the embodiment of FIG. 3 in that the upper surface 31a of the first pixel defining layer 31 has a surface roughness (e.g., a predetermined surface roughness), but is different from the embodiment of FIG. 3 in that the side surface 31b of the first pixel defining layer 31 has a relatively smooth surface.

That is, the surface roughness of the side surface 31b of the first pixel defining layer 31 is smaller than the surface roughness of the upper surface 31a of the first pixel defining layer 31, and may be similar to or substantially the same as the surface roughness of the first electrode 20. In an embodiment, the upper surface 31a of the first pixel defining layer 31 is a plasma-treated surface, while the side surface 31b of the first pixel defining layer 31 may not be a plasma-treated surface.

In the present embodiment, although the side surface 31b of the first pixel defining layer 31 does not have a rough surface, since the upper surface 31a of the first pixel defining layer 31 still has a surface roughness (e.g., a predetermined surface roughness), it is possible to increase the contact area with the second pixel defining layer 32 disposed thereon. Thus, the adhesion between the first pixel defining layer 31 and the second pixel defining layer 32 can be improved.

Figure 6:
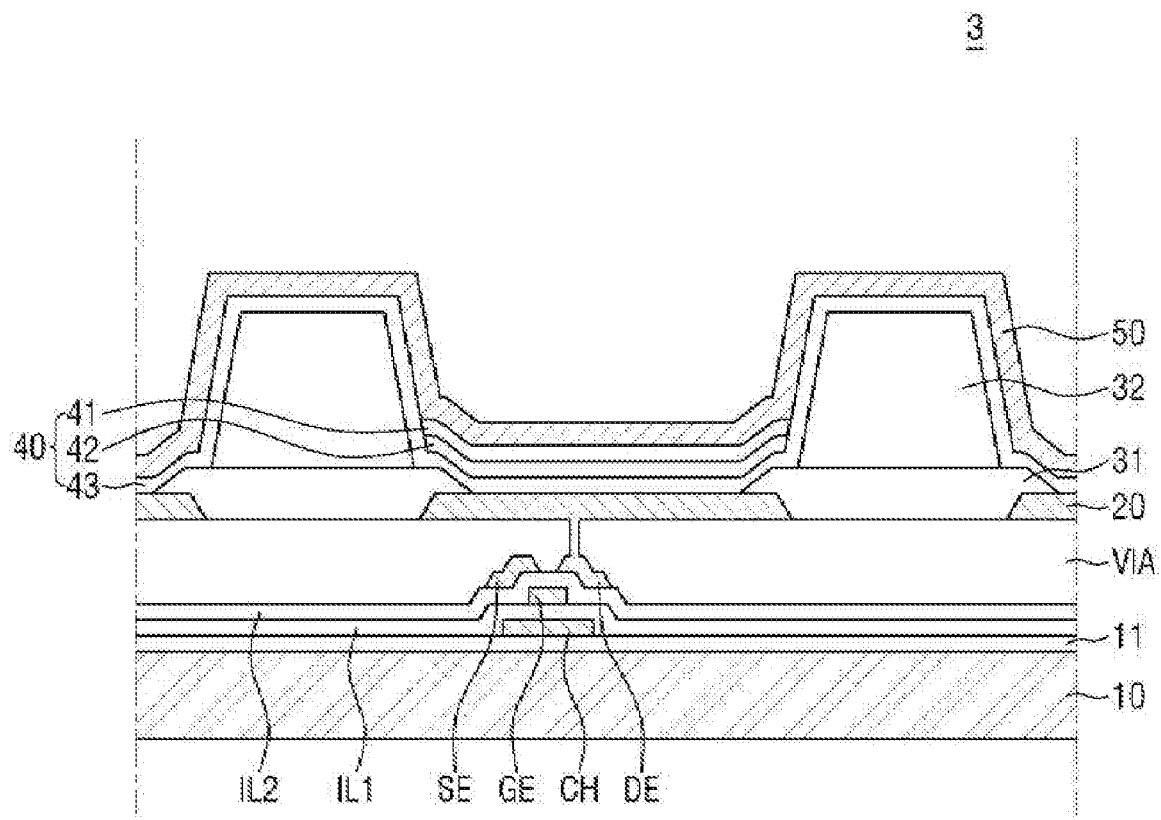
FIG. 6 is a cross-sectional view of a display device according to another embodiment.

FIG. 6 is a cross-sectional view of a display device according to another embodiment of the present disclosure.

In a display device 3 illustrated in FIG. 6, the hole mediating layer 43 of the organic layer 40 may be formed as a common layer without distinction of pixels.

In an embodiment, the hole mediating layer 43 may be continuously disposed on the substrate 10 without distinction of pixels. Although the hole mediating layer 43 is formed as a common layer, the light emission of the organic light emitting element may be performed only in the light emission region overlapping the organic light emitting layer 42. The hole mediating layer 43 may completely cover the structures, such as the first electrode 20, the first pixel defining layer 31, and the second pixel defining layer 32, located under the hole mediating layer 43.

The hole mediating layer 43 may be in contact with a surface of the second pixel defining layer 32 and a surface of the first pixel defining layer 31 exposed by the second pixel defining layer 32. Since a surface of the first pixel defining layer 31 has a surface roughness (e.g., a predetermined surface roughness), the contact area between the first pixel defining layer 31 and the second pixel defining layer 32 and between the first pixel defining layer 31 and the hole mediating layer 43 can be increased and the adhesion can be improved as described above.

Figure 7:
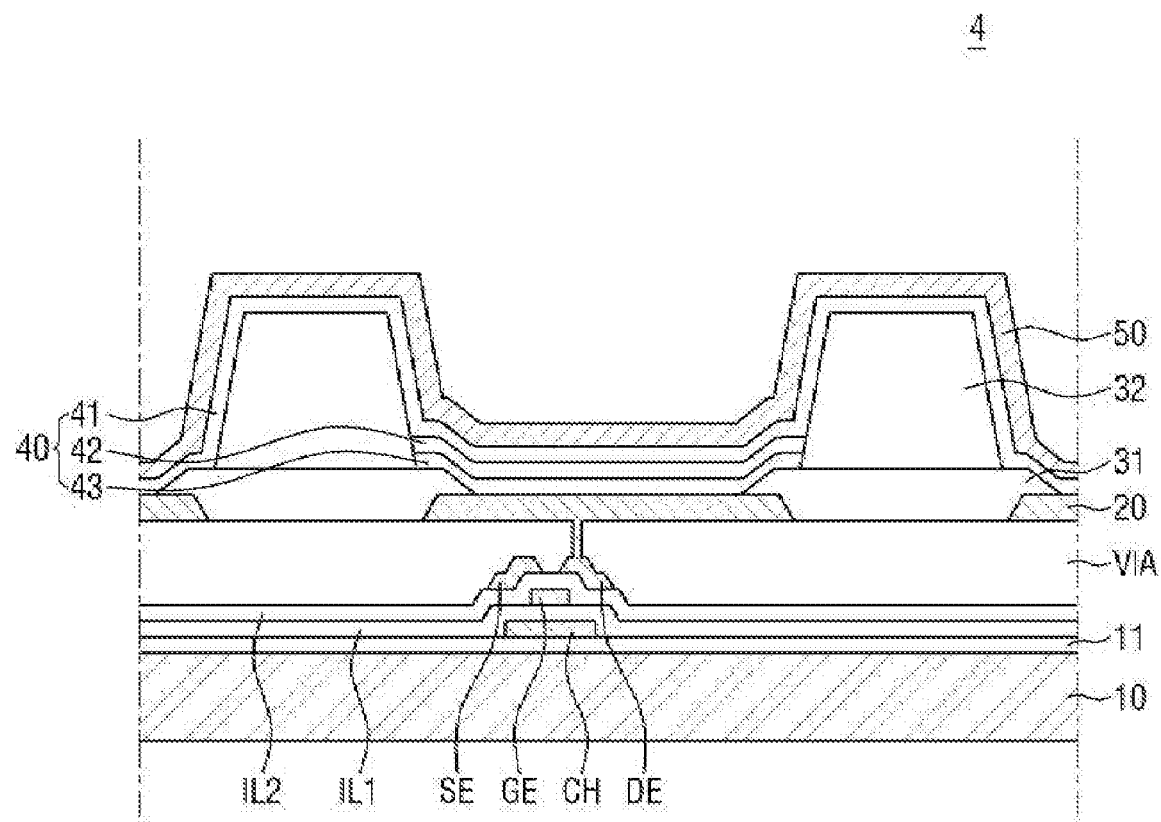
FIG. 7 is a cross-sectional view of a display device according to another embodiment.

FIG. 7 is a cross-sectional view of a display device according to another embodiment.

In a display device 4 illustrated in FIG. 7, the electron mediating layer 41 of the organic layer 40 may be formed as a common layer without distinction of pixels.

In an embodiment, the electron mediating layer 41 may be continuously disposed on the substrate 10 without distinction of pixels. Although the electron mediating layer 41 is formed as a common layer, the light emission of the organic light emitting element may be performed only in the light emission region overlapping the organic light emitting layer 42. The electron mediating layer 41 may completely cover the structures, such as the first electrode 20, the first pixel defining layer 31, and the second pixel defining layer 32, located under the electron mediating layer 41.

Although not shown in the drawings, both the hole mediating layer 43 and the electron mediating layer 41 may be formed as a common layer according to an embodiment.

Figure 8:
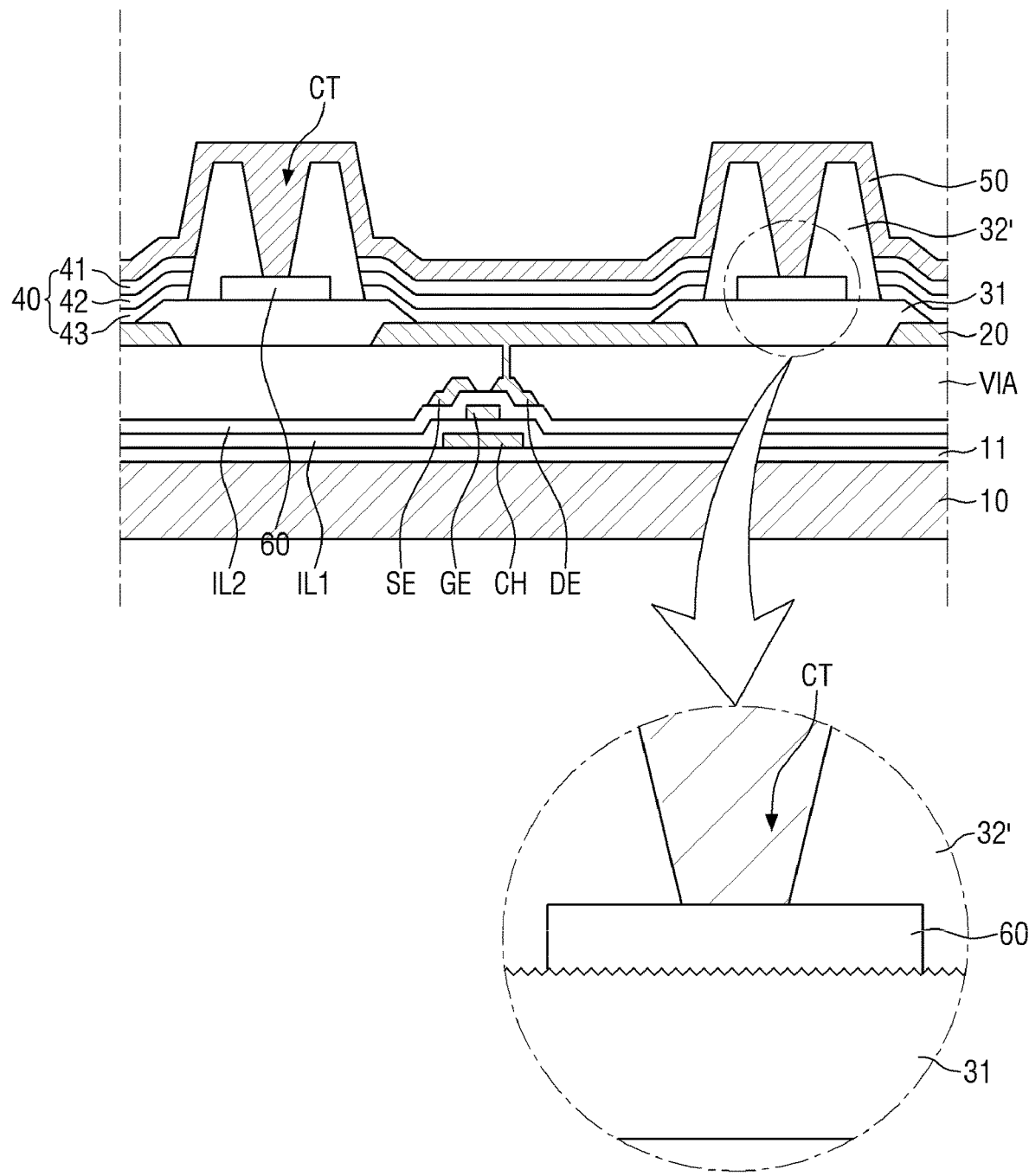
FIG. 8 is a cross-sectional view of a display device according to another embodiment.

FIG. 8 is a cross-sectional view of a display device according to another embodiment.

Referring to FIG. 8, a display device 5 according to the present embodiment is different from the embodiment of FIG. 3 in that a metal layer 60 is further disposed on the first pixel defining layer 31.

The metal layer 60 is disposed between the first pixel defining layer 31 and a second pixel defining layer 32' and is in contact with a surface of the second pixel defining layer 32'.

A width of the metal layer 60 may be smaller than a width of the pixel defining layer 30. The width of the metal layer 60 may be smaller than the width of the upper surface 31a of the first pixel defining layer 31 and the width of the lower surface of the second pixel defining layer 32'. In an embodiment, the metal layer 60 may be sandwiched between the first pixel defining layer 31 and the second pixel defining layer 32' such that a surface and another surface of the metal layer 60 can be completely covered by the pixel defining layer 30. A thickness of the metal layer 60 may be smaller than a thickness of the first pixel defining layer 31, but the present disclosure is not limited thereto.

The metal layer 60 may be in contact with the first pixel defining layer 31 having a surface roughness (e.g., a predetermined surface roughness). For example, the metal layer 60 may be in contact with the upper surface 31a of the first pixel defining layer 31 having a surface roughness (e.g., a predetermined surface roughness). When the surface where the metal layer 60 and the first pixel defining layer 31 are in contact has a surface roughness (e.g., a predetermined surface roughness), the contact area between the metal layer 60 and the first pixel defining layer 31 can be increased to improve the adhesion between the metal layer 60 and the first pixel defining layer 31.

The second pixel defining layer 32' may be disposed on the metal layer 60. When the second pixel defining layer 32' is an organic layer, the metal layer 60 and the second pixel defining layer 32' may be in contact with each other, such that the second pixel defining layer 32' can be more firmly attached. That is, the metal layer 60 having strong adhesion to the second pixel defining layer 32' is interposed between the first pixel defining layer 31 and the second pixel defining layer 32' such that the adhesion between the first pixel defining layer 31 and the second pixel defining layer 32' can be further improved. In other words, since the metal layer 60 is further disposed between the pixel defining layers 30 while one surface of the first pixel defining layer 31 has a surface roughness (e.g., a predetermined surface roughness), the adhesion between the pixel defining layers 30 can be further improved. Thus, it is possible to prevent or substantially prevent a peeling failure of the second pixel defining layer 32' and improve the display quality of the display device as described above.

The metal layer 60 may be formed of a conductive material. For example, the metal layer 60 may be formed of a same material as the gate electrode, the source/drain electrode, or the first electrode 20 of the thin film transistor.

In an embodiment, the second pixel defining layer 32' may include a contact hole CT exposing a portion of the metal layer 60. The second electrode 50 may be connected to the metal layer 60 through the contact hole CT. When the metal layer 60 is connected to the second electrode 50, the metal layer 60 may be used as an auxiliary electrode of the second electrode 50. As the metal layer 60 is electrically connected to the second electrode 50, the resistance of the second electrode 50 can be lowered.

Figure 9:
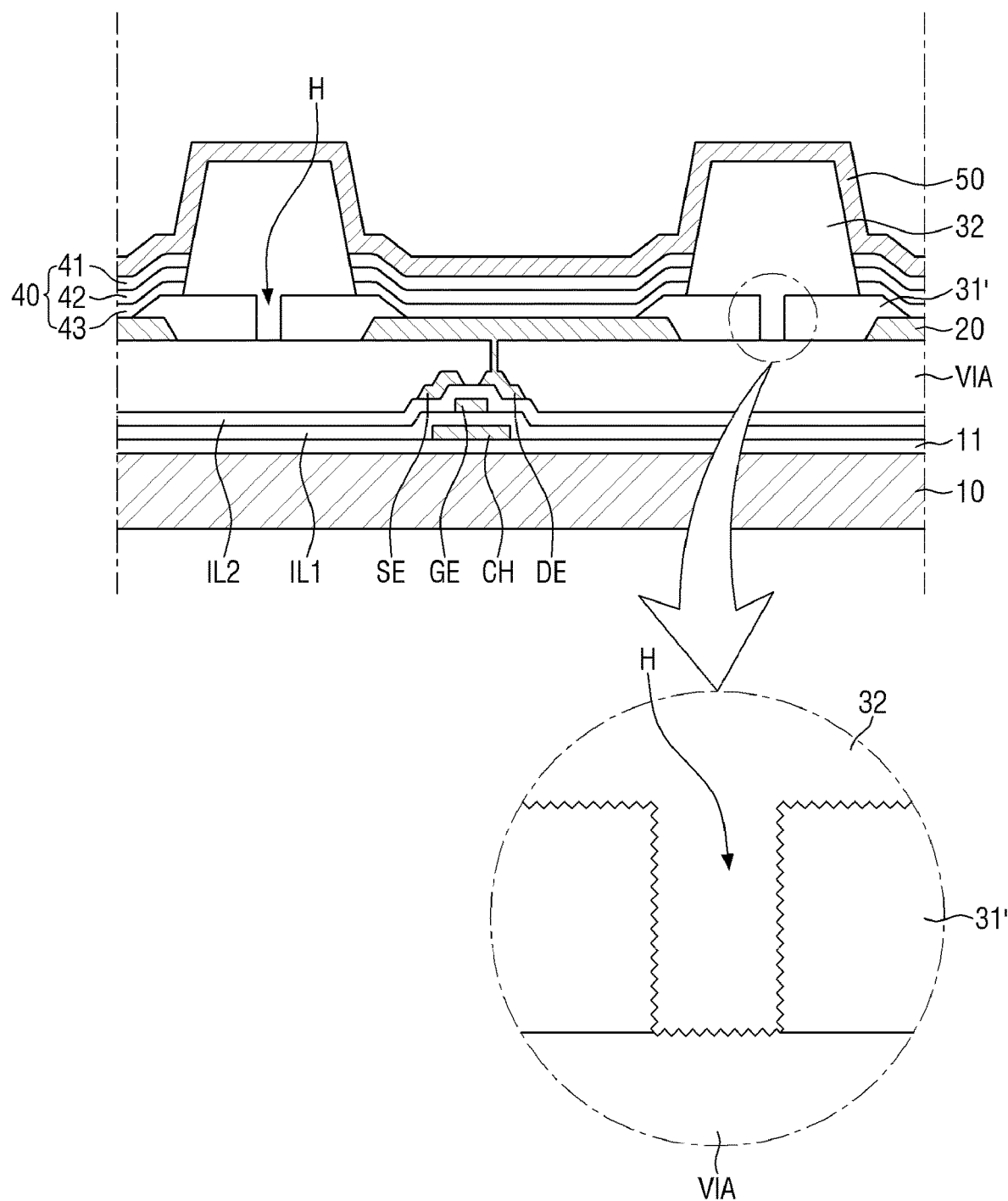
FIG. 9 is a cross-sectional view of a display device according to another embodiment.

FIG. 9 is a cross-sectional view of a display device according to another embodiment.

Referring to FIG. 9, a display device 6 according to an embodiment is different from the embodiment of FIG. 3 in that a first pixel defining layer 31' includes a hole H.

The first pixel defining layer 31' may include at least one hole H passing therethrough in a thickness direction. The inside of the hole H of the first pixel defining layer 31' may be filled with the second pixel defining layer 32. The second pixel defining layer 32 may be in contact with the inner wall of the hole H and, accordingly, the contact area between the first pixel defining layer 31' and the second pixel defining layer 32 can be increased. Further, a portion of the second pixel defining layer 32 is inserted into the hole H such that the second pixel defining layer 32 is more firmly coupled to the first pixel defining layer 31', thereby preventing or substantially preventing the second pixel defining layer 32 from being peeled off.

In an embodiment, the inner wall of the hole H of the first pixel defining layer 31' may have a surface roughness (e.g., a predetermined surface roughness) similarly to a surface of the first pixel defining layer 31'. Accordingly, the contact area between the first pixel defining layer 31' and the second pixel defining layer 32 can be further increased. In an embodiment, the surface roughness of the inner wall of the hole H may be larger than the surface roughness of the first electrode 20.

The hole H may completely pass through the first pixel defining layer 31' to expose a layer, for example, a via layer VIA disposed under the first pixel defining layer 31'. The second pixel defining layer 32 filling the hole H may be in contact with the surface of the via layer VIA exposed by the hole H. In an embodiment, when the via layer VIA and the second pixel defining layer 32 are organic layers, and the first pixel defining layer 31' is an inorganic layer, by securing the contact area between the organic layers having a relatively strong bonding force through the hole H, the adhesion between them can be improved.

A surface of the via layer VIA exposed by the hole H may have a surface roughness (e.g., a predetermined surface roughness). That is, since a surface of the via layer VIA has a surface roughness (e.g., a predetermined surface roughness), the adhesion with the second pixel defining layer 32 which is in contact with the via layer VIA can be improved.

In an embodiment, the surface roughness of the first pixel defining layer 31' may be larger than the surface roughness of the via layer VIA, and the surface roughness of the via layer VIA may be larger than the surface roughness of the first electrode 20.

FIGS. 10A to 10D are plan views of display devices according to various embodiments, illustrating various shapes of the holes H formed in the first pixel defining layer 31'.

Figure 10A:
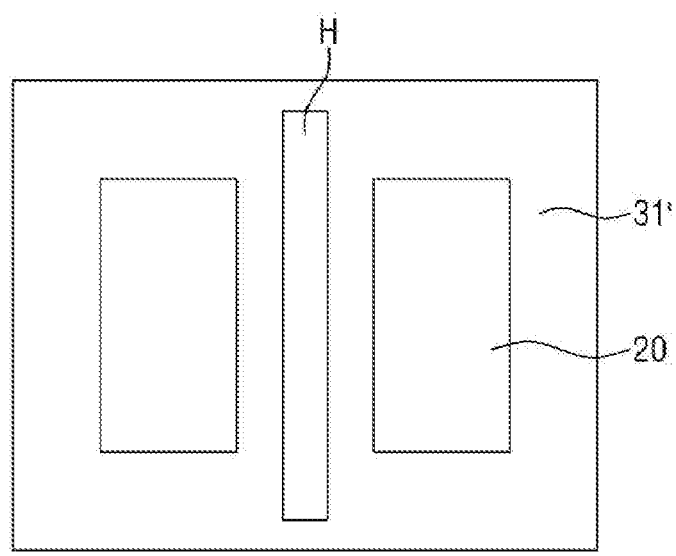
FIGS. 10A to 10D are plan views of display devices according to various embodiments.

Referring to FIG. 10A, in an embodiment, the hole H is disposed between the pixels 70 and may be formed in a linear shape extending in one direction. The planar shape of the hole H may be a rectangular shape as shown in FIG. 10A, but is not limited thereto, and may be a circular or polygonal shape. Although FIG. 10A illustrates that the hole H is formed intermittently for each pixel, the holes H may be continuously formed along the pixel column boundary.

Figure 10B:
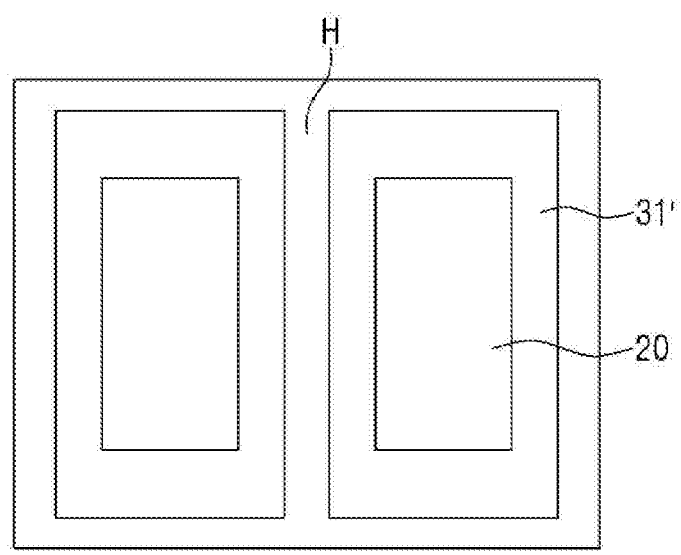
Figure 10C:
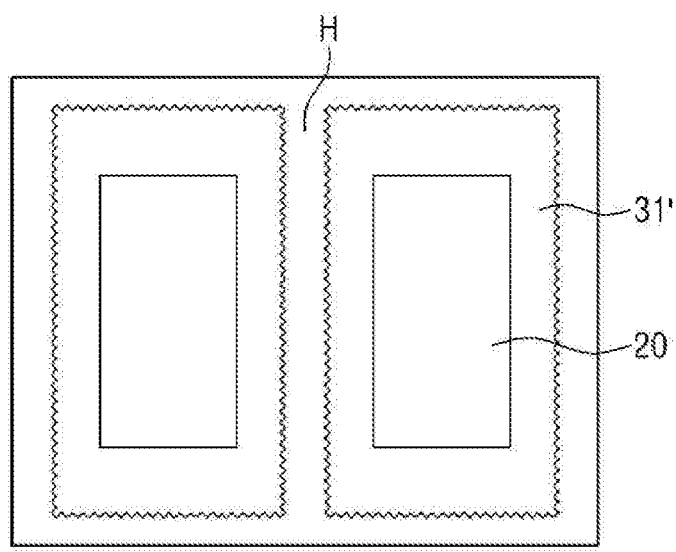

Referring to FIG. 10B, in an embodiment, the holes H may be formed in a lattice structure along the boundaries of the respective pixels 70. The border of the hole H may be a straight line as shown in FIG. 10B, but may also have a shape including irregularities in a plan view. For example, as shown in FIG. 10C, the border of the hole H may include a sawtooth shape. When the border of the hole H has a sawtooth shape, the surface area of the hole H is increased and the adhesion between the first pixel defining layer 31' and the second pixel defining layer 32 can be further improved.

Figure 10D:
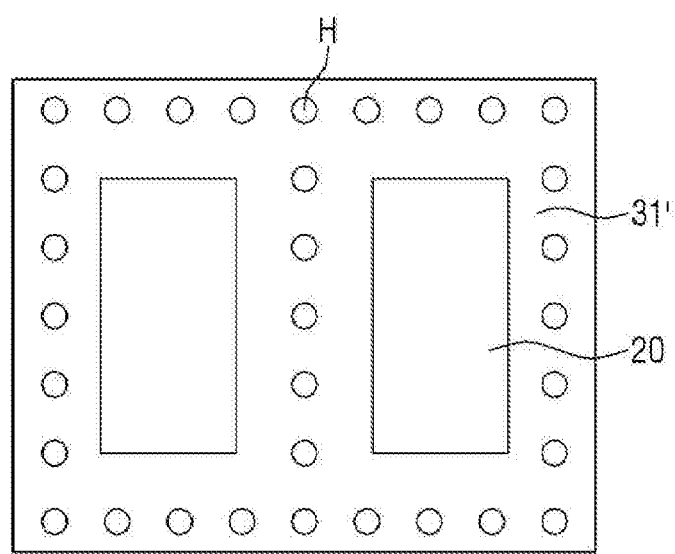

Referring to FIG. 10D, in an embodiment, the hole H is formed along the boundary of each pixel, and a plurality of holes H may be formed to be spaced from each other. When a plurality of holes H are formed, the surface area of the holes H may be further increased, and the adhesion between the pixel defining layers 30 can be further improved.

When the first pixel defining layer 31' includes at least one hole H as described above, the second pixel defining layer 32 may be in contact with the inside of the first pixel defining layer 31' and/or the via layer VIA through the hole H. Accordingly, the contact area between adjacent layers is increased as compared with a case in which the second pixel defining layer 32 is in contact with only the upper surface 31a of the first pixel defining layer 31, such that the adhesion can be further strengthened. Therefore, it is possible to prevent or substantially prevent the second pixel defining layer 32 from being peeled off from the first pixel defining layer 31', thereby further improving the display quality of the display device.

Herein, a method of manufacturing a display device according to an embodiment will be described.

FIGS. 11 to 17 are cross-sectional views showing tasks or steps of a method of manufacturing a display device according to an embodiment, and, more specifically, cross-sectional views showing the tasks or steps, taken along the line II-II' of FIG. 1.

Referring to FIGS. 11 to 17, the tasks or steps of a method of manufacturing a display device according to an embodiment may include forming the first electrode 20 for each pixel on the substrate 10 including a plurality of pixels, forming the first pixel defining layer 31 disposed on the substrate 10 along the boundary of each pixel to include an opening exposing the first electrode 20, performing plasma treatment 100 on a surface of the first pixel defining layer 31, forming the second pixel defining layer 32 on a surface of the first pixel defining layer 31, forming the organic layer 40 disposed on the first electrode 20 in the opening of the pixel defining layer 30, and forming the second electrode 50 on the organic layer 40.

Figure 11:
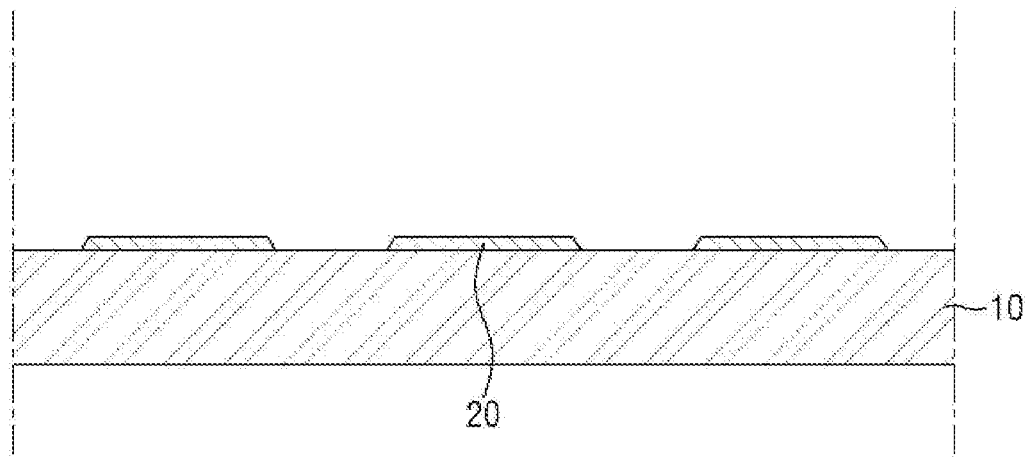
FIGS. 11 to 17 are cross-sectional views showing tasks of a method of manufacturing a display device according to an embodiment.

First, referring to FIG. 11, the first electrode 20 is formed on the substrate 10 including a plurality of pixels. The first electrode 20 is formed for each pixel. For simplicity of description, although it is illustrated in the drawing that the first electrode 20 is formed directly on the substrate 10, the buffer layer 11, the thin film transistor, the via layer VIA, and the like may be disposed between the substrate 10 and the first electrode 20.

Figure 12:
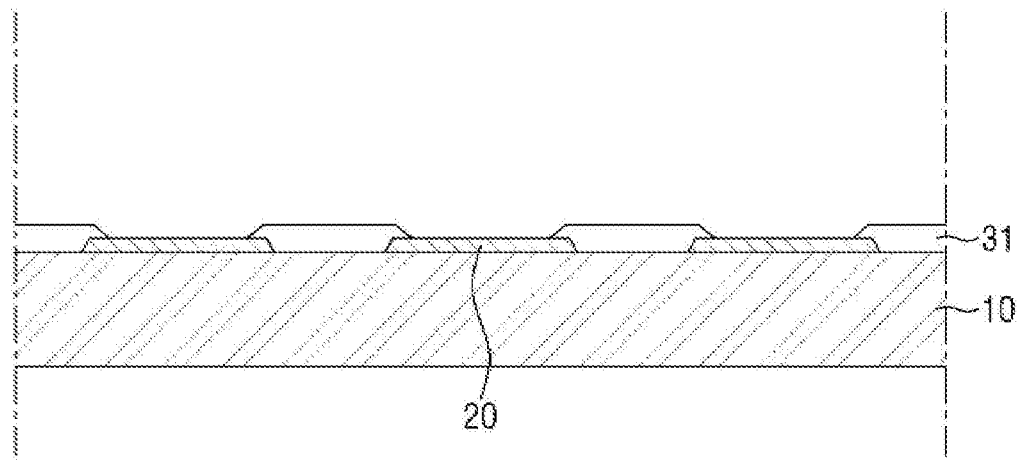

Then, referring to FIG. 12, the first pixel defining layer 31 is formed on the substrate 10 having the first electrode 20 formed thereon. The first pixel defining layer 31 is completed by forming, on the substrate 10, an inorganic layer including, for example, a silicon oxide (SiOx) layer, a silicon nitride (SiNx) layer, a silicon oxynitride (SiON) layer, or a multilayer thereof, and then etching it. The patterned first pixel defining layer 31 is disposed along the boundary of the pixel and includes an opening partially exposing the first electrode 20.

Figure 13:
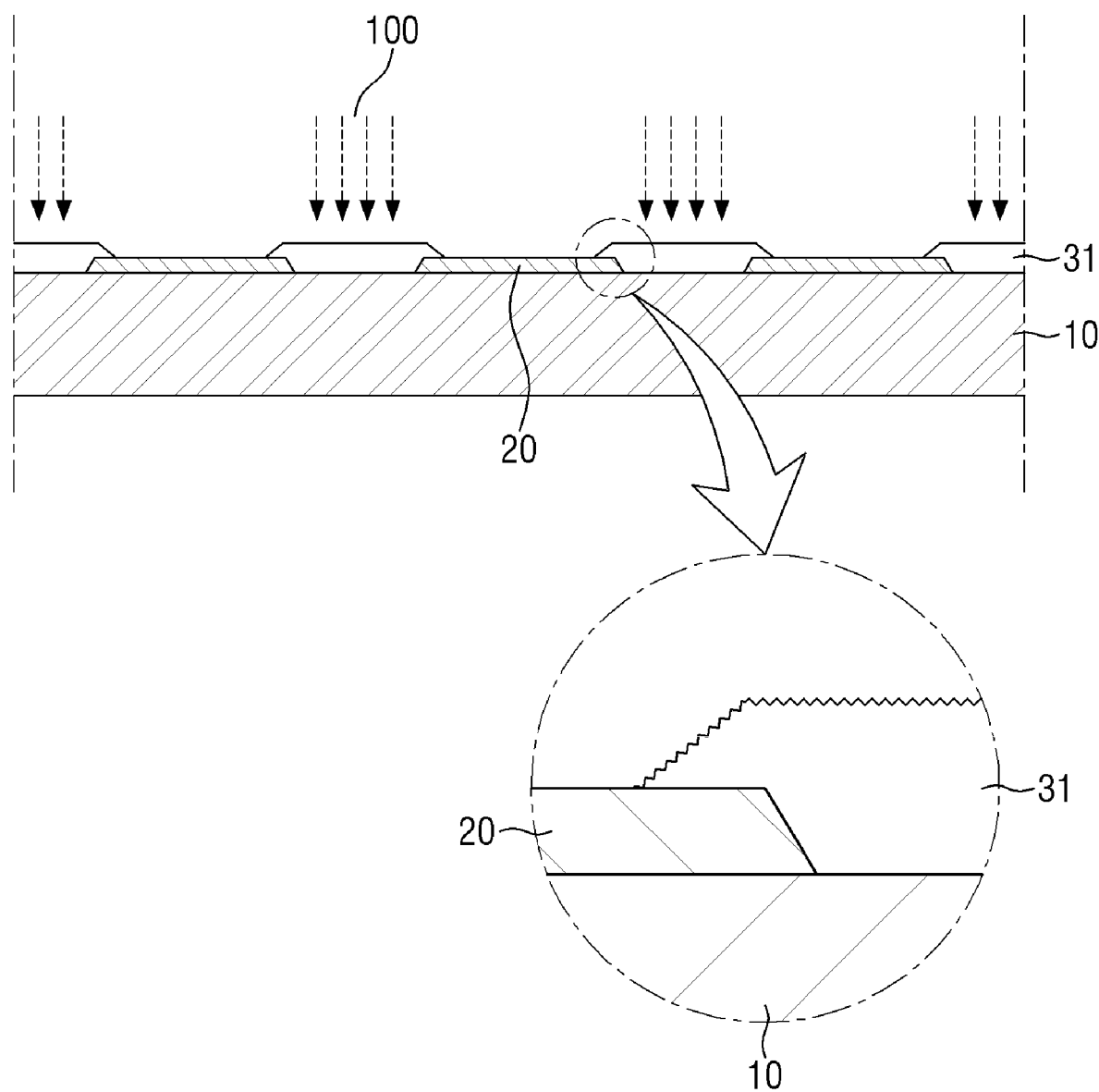

Then, referring to FIG. 13, a surface of the first pixel defining layer 31 is subjected to the plasma treatment 100. A surface roughness (e.g., a predetermined surface roughness) is imparted to a surface of the first pixel defining layer 31 through the plasma treatment 100. The plasma treatment 100 may be performed under a condition that the surface of the first pixel defining layer 31 has a surface roughness larger than that of the first electrode 20 while minimizing or reducing surface damage of the first electrode 20.

In an embodiment, the plasma treatment 100 may be performed using a plasma generating gas containing $O_2$ and $N_2$. The surface roughness of the first pixel defining layer 31 and the surface damage degree of the first electrode 20 can be controlled according to the composition ratio of $O_2$ and $N_2$. For example, if the proportion of the $N_2$ gas in the plasma generating gas is larger than the proportion of the $O_2$ gas in the plasma generating gas, it is possible to prevent or substantially prevent damage of the first electrode 20 while imparting a surface roughness (e.g., a predetermined surface roughness) to a surface of the first pixel defining layer 31. In an embodiment, the composition ratio of the $N_2$ gas and the $O_2$ gas in the step of the plasma treatment 100 may be adjusted within a range of 9:1 to 99:1. If the proportion of the $O_2$ gas in the mixture of the $N_2$ gas and the $O_2$ gas is adjusted to 10% or less, it is possible to prevent or substantially prevent the first electrode 20 from being damaged by preventing or substantially preventing an increase in etching selectivity with respect to the first electrode 20 made of an oxide such as ITO. If the proportion of the $O_2$ gas in the mixture of the $N_2$ gas and the $O_2$ gas is 1% or more, it is advantageous to reduce the processing time of the plasma treatment 100 for securing the surface roughness.

Figure 14:
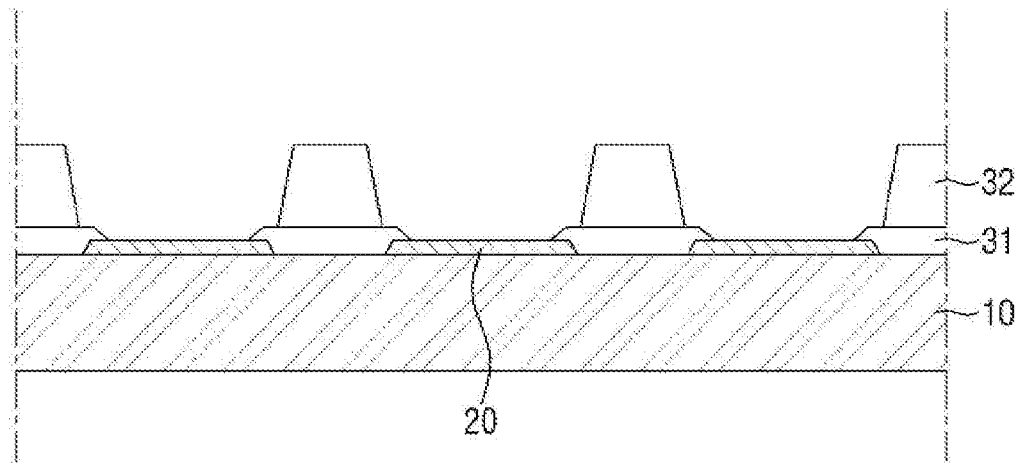

Then, referring to FIG. 14, the second pixel defining layer 32 is formed on a surface of the first pixel defining layer 31. In an embodiment, the second pixel defining layer 32 may be formed by forming, on the substrate 10, an organic layer containing at least one organic material selected from the group consisting of benzocyclobutene (BCB), polyimide (PI), polyamide (PA), acrylic resin, and phenol resin, and then patterning the organic layer through an exposure and development process. Since the second pixel defining layer 32 is formed on a surface of the first pixel defining layer 31 roughened by the plasma treatment 100, it is possible to have improved adhesion to the first pixel defining layer 31 as described above.

Then, the organic layer 40 is formed on the first electrode 20 exposed by the opening of the pixel defining layer 30. In an embodiment, the organic layer 40 may be formed by inkjet printing. A method of forming the organic layer 40 by inkjet printing will be described in further detail with reference to FIGS. 15 and 16.

Figure 15:
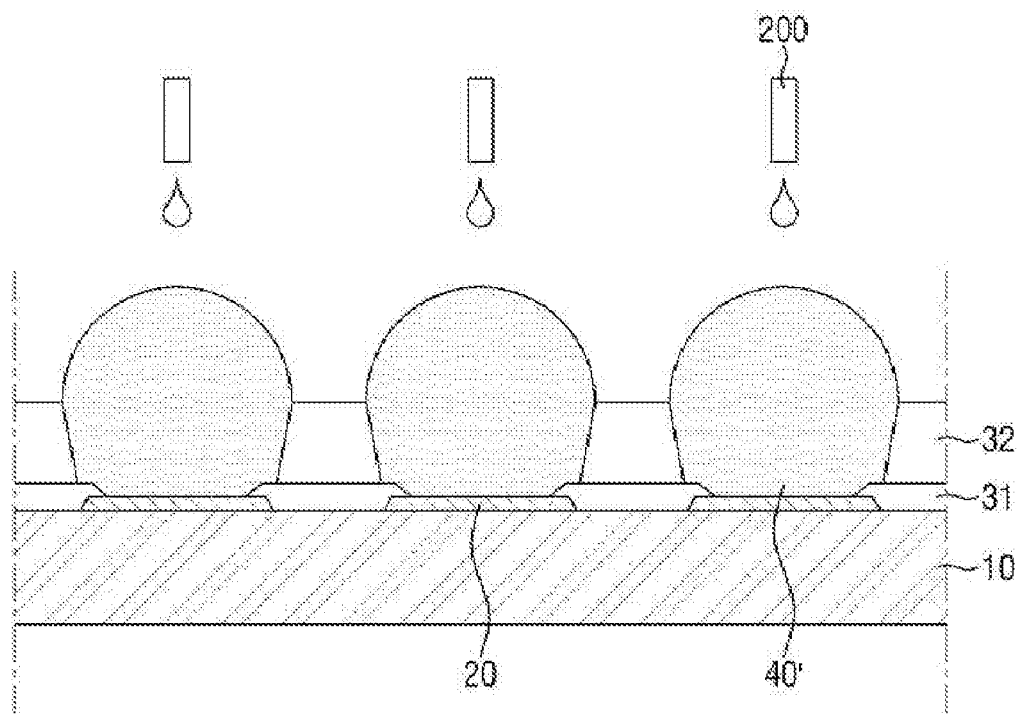

Referring to FIG. 15, a task or step of forming the organic layer 40 by inkjet printing may include preparing a solvent and an organic layer forming ink 40' containing an organic material dispersed in the solvent, and applying the organic layer forming ink 40' into each pixel 70 using an inkjet printing apparatus 200. In an embodiment, the organic layer forming ink 40' is prepared by dissolving the organic material of the organic layer 40 in the solvent, and the organic layer forming ink 40' is discharged from the inkjet printing apparatus 200 and applied into each region defined by the pixel defining layer 30. For example, the organic layer forming ink 40' may be applied to be in contact with a surface of the first electrode 20 through the opening of the pixel defining layer 30. The organic layer forming ink 40' may be discharged from the inkjet printing apparatus 200 and applied to be in contact with a surface of the first electrode 20, the side surface of the second pixel defining layer 32, the side surface 31b of the first pixel defining layer 31, and the edge portion 31a_2 of the upper surface 31a of the first pixel defining layer 31 exposed by the second pixel defining layer 32.

Figure 16:
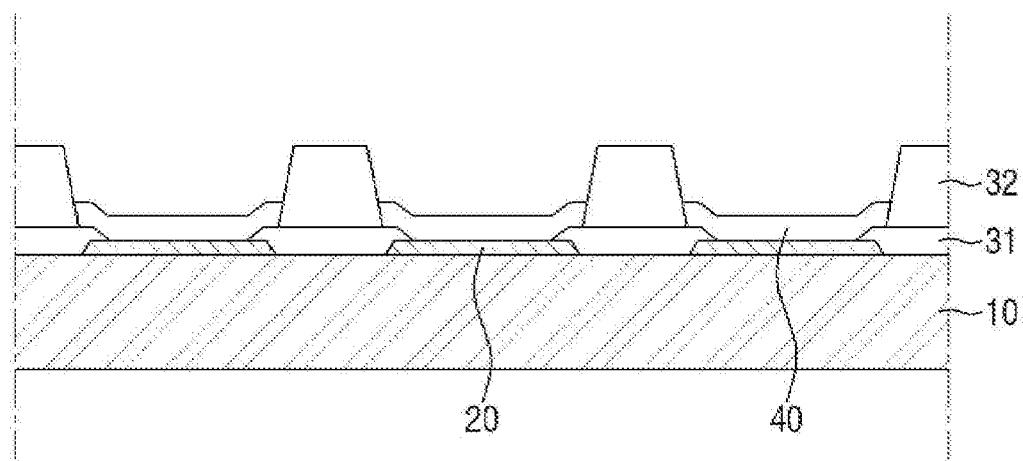

Then, referring to FIG. 16, the solvent of the organic layer forming ink 40' is dried to form the organic layer 40 for each pixel 70. In some embodiments, the thickness of the organic layer 40 after drying may be different for each region. The thickness of the organic layer 40 may be defined as the shortest distance among the vertical distances from the bottom surface to the top surface of the organic layer 40. For example, the thickness of the central portion c1 of the organic layer 40 may be different from the thickness of the edge portion e1 of the organic layer 40, and the thickness of the edge portion e1 may be partially greater than the thickness of the central portion c1.

Figure 17:
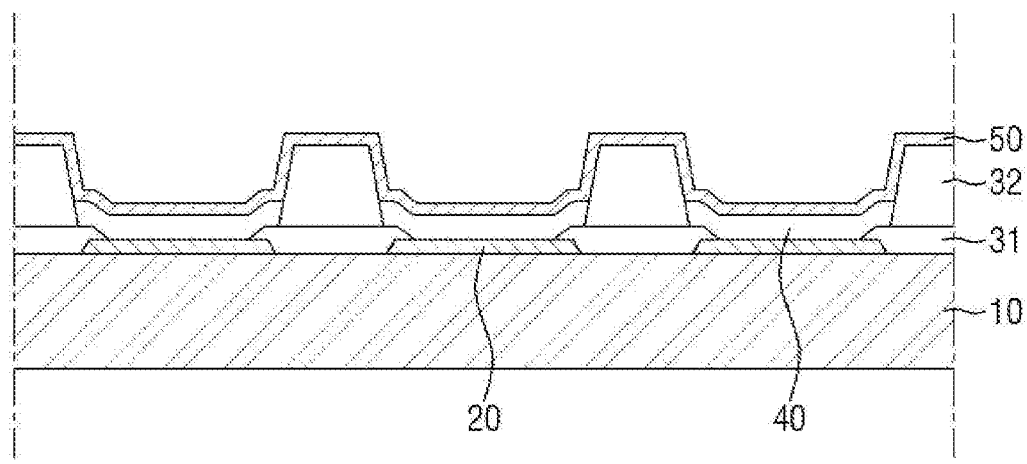

Then, referring to FIG. 17, the second electrode 50 is formed on the organic layer 40. In an embodiment, the second electrode 50 is formed by a deposition process, and, for example, vacuum deposition or sputtering may be used, but the present disclosure is not limited thereto. By forming the second electrode 50, the display device 1 as shown in FIG. 3 can be completed.

Herein, a method of manufacturing a display device according to another embodiment of the present disclosure will be described. A redundant description may be omitted and differences will be mainly described.

Figure 18:
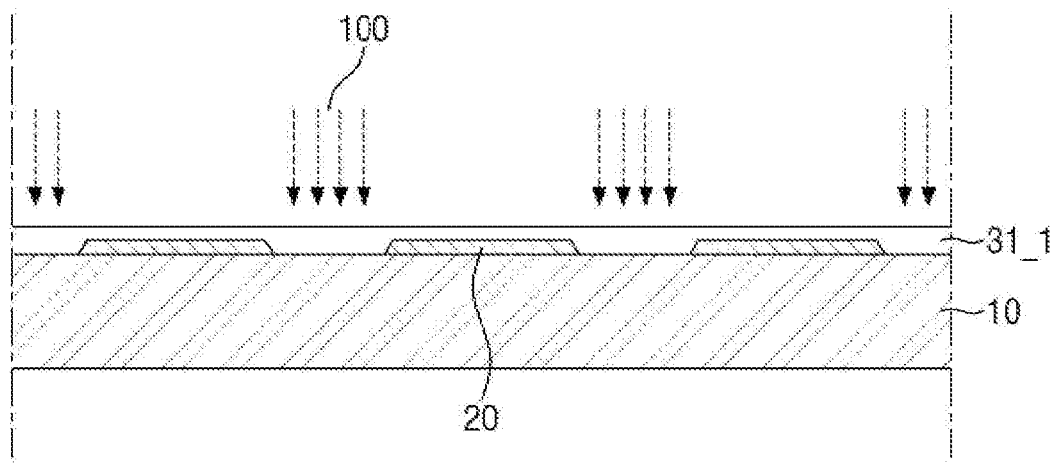
FIGS. 18 and 19 are cross-sectional views showing tasks of a method of manufacturing a display device according to another embodiment.
Figure 19:
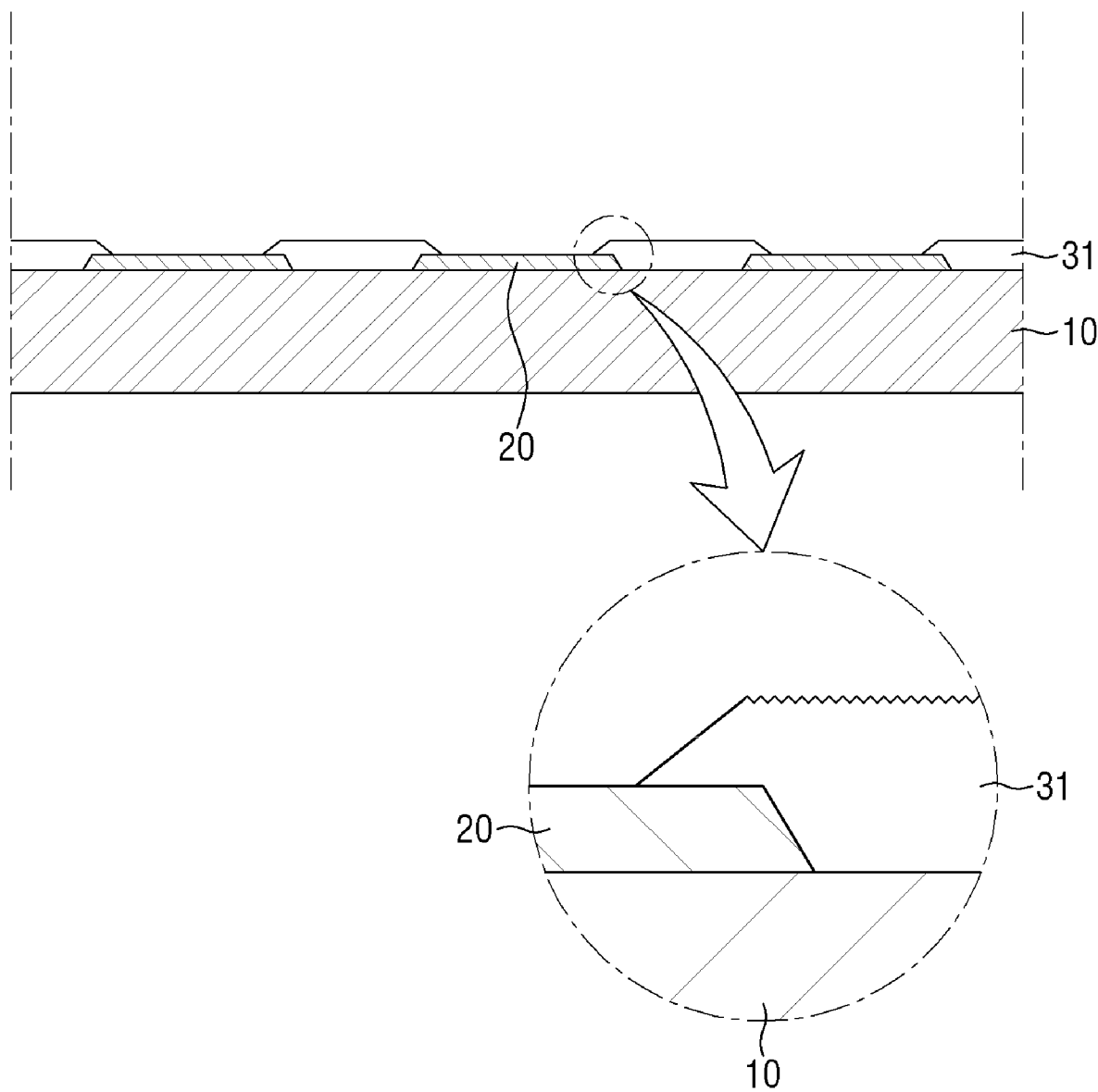

FIGS. 18 and 19 are cross-sectional views showing tasks or steps of a method of manufacturing a display device according to another embodiment.

FIGS. 18 and 19 illustrate some tasks or steps of a method of manufacturing a display device according to the embodiment of FIG. 5. The present embodiment is different from the embodiment of FIGS. 11 to 17 in that the task or step of forming the first electrode 20 of FIG. 11 is performed and a surface of an inorganic layer 31_1 is subjected to the plasma treatment 100 and then is etched to form the first pixel defining layer 31.

Referring to FIG. 18, the tasks or steps up to the task or step of forming the first electrode 20 on the substrate 10 and forming the inorganic layer 31_1 thereon are the same as some tasks or steps of FIGS. 11 and 12. Thereafter, the surface of the inorganic layer 31_1 is subjected to the plasma treatment 100 before patterning the inorganic layer 31_1.

The plasma treatment 100 may be performed in the same manner as described with reference to FIG. 13, but may be performed under other conditions that may increase the plasma processing rate. That is, in this task or step, since the plasma treatment 100 is performed while the first electrode 20 is covered with and protected by the inorganic layer 31_1, the first electrode 20 is less likely to be damaged by the plasma. Therefore, since the damage prevention condition of the first electrode 20 described with reference to FIG. 13 may not be considered in this task or step, it is possible to more freely design the process conditions. For example, a method of reducing the time required to secure the surface roughness by increasing the $O_2$ content of the plasma generating gas by 10% or more may be selected.

Then, referring to FIG. 19, the inorganic layer 31_1 having a surface roughness (e.g., a predetermined surface roughness) is etched. As a result, the first pixel defining layer 31 including the opening exposing the first electrode 20 is completed. As the etching process is performed after the plasma treatment 100, the upper surface 31a of the first pixel defining layer 31 has a surface roughness (e.g., a predetermined surface roughness). However, since the side surface 31b of the first pixel defining layer 31 is a surface not subjected to the plasma treatment 100, it may have a smoother surface.

Thereafter, the display device 2 as shown in FIG. 5 may be manufactured by performing the subsequent tasks or steps which may be substantially the same as those of FIGS. 14 to 17.

However, aspects and effects of embodiments of the present disclosure are not restricted to those set forth herein. The above and other aspects and effects of embodiments will become more apparent to one of ordinary skill in the art to which the embodiments pertain by referencing the claims.

What is claimed is:

1. A display device comprising:
   a substrate;
   a plurality of pixels on the substrate;
   a first electrode arranged for each pixel on the substrate;
   a pixel defining layer on the substrate along a boundary of each pixel and including an opening exposing the first electrode of the pixel;
   an organic layer on the first electrode in the opening of the pixel defining layer; and
   a second electrode on the organic layer,
   wherein the pixel defining layer comprises a first pixel defining layer and a second pixel defining layer stacked on a surface of the first pixel defining layer,
   wherein the surface of the first pixel defining layer comprises an upper surface and a side surface,
   wherein the upper surface of the first pixel defining layer comprises an overlap portion which is a region overlapping the second pixel defining layer and an edge portion which is a region excluding the overlap portion, and
   wherein a surface roughness of the upper surface of the first pixel defining layer in the overlap portion is greater than a surface roughness of the first electrode.

2. The display device of claim 1, wherein the surface roughness of the upper surface of the first pixel defining layer is greater than a surface roughness of the side surface of the first pixel defining layer.

3. The display device of claim 1, wherein the organic layer includes a central portion and an edge portion,
   wherein the central portion of the organic layer is in contact with the first electrode in the opening of the pixel defining layer,
   wherein the edge portion of the organic layer is in contact with the side surface of the first pixel defining layer, and
   wherein a surface roughness of the side surface of the first pixel defining layer is greater than the surface roughness of the first electrode.

4. The display device of claim 3, wherein the upper surface of the first pixel defining layer is plasma-treated.

5. The display device of claim 1, further comprising a via layer between the first electrode and the substrate,
   wherein the first pixel defining layer is in direct contact with an upper surface of the via layer.

6. The display device of claim 5, wherein the first pixel defining layer includes a hole exposing the via layer, and
   wherein a surface roughness of the via layer exposed by the hole is greater than the surface roughness of the first electrode.

7. The display device of claim 1, further comprising a metal layer on the first pixel defining layer and in direct contact with the second pixel defining layer,
   wherein a width of the metal layer is smaller than a width of the pixel defining layer.

8. The display device of claim 7, wherein the second pixel defining layer includes a contact hole exposing the metal layer, and
   wherein the second electrode is electrically connected to the metal layer through the contact hole.

9. A display device comprising:
   a substrate;
   a plurality of pixels on the substrate;
   a first electrode arranged for each pixel on the substrate;
   a pixel defining layer on the substrate along a boundary of each pixel and including an opening exposing the first electrode of the pixel;
   an organic layer on the first electrode in the opening of the pixel defining layer; and
   a second electrode on the organic layer,
   wherein the pixel defining layer comprises a first pixel defining layer and a second pixel defining layer stacked on a surface of the first pixel defining layer,
   wherein the surface of the first pixel defining layer includes an upper surface and a side surface,
   wherein the upper surface of the first pixel defining layer comprises an overlap portion which is a region overlapping the second pixel defining layer and an edge portion which is a region excluding the overlap portion, and
   wherein a water contact angle of the upper surface of the first pixel defining layer in the overlap portion is greater than a water contact angle of the first electrode.

10. The display device of claim 9,
    wherein a water contact angle of the overlap portion of the upper surface of the first pixel defining layer is smaller than a water contact angle of the edge portion of the upper surface of the first pixel defining layer.

11. The display device of claim 9, wherein the organic layer includes a central portion and an edge portion,
    wherein the central portion of the organic layer is in contact with the first electrode in the opening of the pixel defining layer,
    wherein the edge portion of the organic layer is in contact with the side surface of the first pixel defining layer, and
    wherein a water contact angle of the side surface of the first pixel defining layer is larger than the water contact angle of the first electrode.

12. The display device of claim 9, wherein a water contact angle of the first pixel defining layer is from 20° to 55°.

13. The display device of claim 9, further comprising a via layer between the first electrode and the substrate,
    wherein the first pixel defining layer is in direct contact with an upper surface of the via layer.

14. The display device of claim 13, wherein the first pixel defining layer includes a hole exposing the via layer, and
    wherein a water contact angle of the via layer exposed by the hole is larger than the water contact angle of the first electrode.

15. The display device of claim 9, further comprising a metal layer on the first pixel defining layer and in direct contact with the second pixel defining layer,
    wherein a width of the metal layer is smaller than a width of the pixel defining layer,
    wherein the second pixel defining layer includes a contact hole exposing the metal layer, and
    wherein the second electrode is electrically connected to the metal layer through the contact hole.

16. A method of manufacturing a display device, the method comprising:
    forming a first electrode for each pixel of a plurality of pixels on a substrate;
    forming a pixel defining layer on the substrate along a boundary of each of the pixels, the pixel defining layer including an opening exposing the first electrode of the pixel;
    forming an organic layer on the first electrode in the opening of the pixel defining layer; and
    forming a second electrode on the organic layer,
    wherein the forming the pixel defining layer comprises:
    forming a first pixel defining layer comprising an upper surface which is plasma-treated, the first pixel defining layer further comprising a side surface; and forming a second pixel defining layer on the plasma-treated upper surface of the first pixel defining layer, wherein the upper surface of the first pixel defining layer comprises an overlap portion which is a region overlapping the second pixel defining layer and an edge portion which is a region excluding the overlap portion, and wherein a surface roughness of the upper surface of the first pixel defining layer in the overlap portion is greater than a surface roughness of the first electrode.

17. The method of claim 16, wherein the forming the first pixel defining layer which is plasma-treated comprises:

patterning the first pixel defining layer on the substrate; and performing plasma treatment on the patterned first pixel defining layer.

18. The method of claim 16, wherein the forming the first pixel defining layer which is plasma-treated comprises:

forming a material layer for the first pixel defining layer on the substrate;

performing plasma treatment on a surface of the material layer for the first pixel defining layer; and patterning the plasma-treated material layer for the first pixel defining layer.

19. The method of claim 16, wherein the forming the first pixel defining layer which is plasma-treated comprises performing plasma treatment using a plasma generating gas in which $N_2$ gas and $O_2$ gas are mixed at a ratio of 9:1 to 99:1.

20. The method of claim 16, wherein the forming the organic layer comprises:

preparing an ink containing an organic material dispersed in a solvent;

applying the ink into the opening of the pixel defining layer through inkjet printing; and drying the ink.

* * * * *